(12) United States Patent
Winger et al.

(10) Patent No.: US 8,235,035 B2
(45) Date of Patent: Aug. 7, 2012

(54) INFLATABLE SOLAR ENERGY COLLECTOR APPARATUS

(75) Inventors: Ian L. Winger, Tallahassee, FL (US); Sean A. Barton, Quincy, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 562 days.

(21) Appl. No.: 12/386,291

(22) Filed: Apr. 16, 2009

(65) Prior Publication Data

US 2009/0260620 A1    Oct. 22, 2009

Related U.S. Application Data

(60) Provisional application No. 61/124,745, filed on Apr. 18, 2008.

(51) Int. Cl.
*F24J 2/38* (2006.01)
*F24J 2/10* (2006.01)
*G02B 7/188* (2006.01)

(52) U.S. Cl. .......................... 126/600; 126/697; 359/847

(58) Field of Classification Search .................. 126/600, 126/697; 359/847
See application file for complete search history.

(56) References Cited

U.S. PATENT DOCUMENTS

| | | | |
|---|---|---|---|
| 3,031,928 A | 5/1962 | Kopito | |
| 3,893,755 A | 7/1975 | Cobarg | |
| 3,972,600 A | 8/1976 | Cobarg | |
| 4,051,834 A * | 10/1977 | Fletcher et al. | 126/625 |
| 4,119,366 A | 10/1978 | Lemaitre | |
| 4,861,980 A | 8/1989 | Dakin et al. | |
| 5,109,300 A | 4/1992 | Waddell | |
| 5,498,868 A | 3/1996 | Nishikawa et al. | |
| 6,302,542 B1 | 10/2001 | Tsai | |
| 6,726,338 B2 | 4/2004 | Kaneko | |
| 6,886,952 B2 | 5/2005 | Kaneko | |
| 2004/0017622 A1 | 1/2004 | Kaneko | |
| 2010/0229850 A1* | 9/2010 | Sankrithi | 126/601 |

FOREIGN PATENT DOCUMENTS

WO    WO2008037108 A2 *    4/2008

* cited by examiner

*Primary Examiner* — Kenneth Rinehart
*Assistant Examiner* — William Corboy
(74) *Attorney, Agent, or Firm* — J. Wiley Horton

(57) ABSTRACT

An inflatable solar energy collector. The device uses two elongated and pressure-stabilized air chambers with a trough-shaped reflecting surface in between. The curvature of the reflecting surface is adjusted by adjusting the differential pressure between the two air chambers. The device can be configured to provide a focal point outside the air chambers or inside the air chambers. For the version using the external focal point an external energy receiver is appropriately positioned. For the version using the internal focal point, the receiver is mounted inside one of the air chambers.

14 Claims, 24 Drawing Sheets

$P_1 > P_2 > P_3 > P_4$

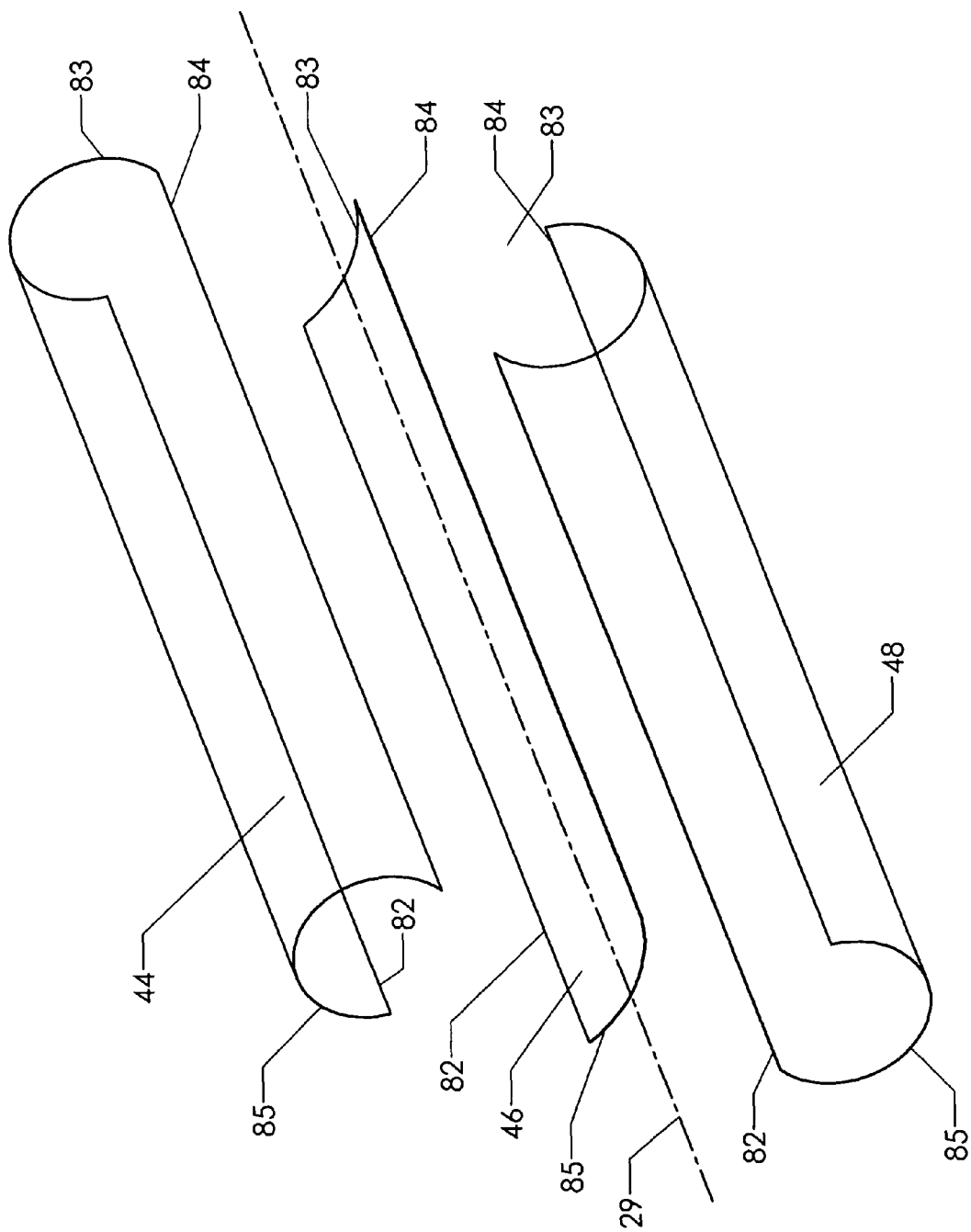

$P_1 > P_2 > P_3 > P_4$

INFLATABLE SOLAR ENERGY COLLECTOR APPARATUS

CROSS-REFERENCES TO RELATED APPLICATIONS

This application claims the benefit pursuant to 37 C.F.R. §1.53(c) of an earlier-filed provisional application. The provisional application was filed on Apr. 18, 2008 and was assigned application Ser. No. 61/124,715. Ian L. Winger was listed as an inventor in the provisional application. Sean A. Barton is named as inventor for the first time in this submission.

STATEMENT REGARDING FEDERALLY SPONSORED RESEARCH OR DEVELOPMENT

Not Applicable.

MICROFICHE APPENDIX

Not Applicable

BACKGROUND OF THE INVENTION

1. Field of the Invention

This invention relates to the field of renewable energy. More specifically, the invention comprises an inflatable solar collector and associated components.

2. Description of the Related Art

Solar collectors are used to convert the sun's energy into a more useful form. There are two broad classes of collectors—those that create electricity using the photovoltaic effect and those which use solar radiation to heat a working fluid. There are many factors influencing the design of collectors including the manufacturing costs, the type and quantity of energy output needed, the space available for the installation, and the environmental conditions at the installation site.

It is known in the art to use mirrors or lenses to concentrate the available energy into a relatively small surface area. In photovoltaic applications, this concentration allows the use of a smaller array of cells which are capable of handling a higher wattage. In heating applications, the concentration allows a much higher heat transfer rate and a higher ultimate working temperature.

Various mirror and lens combinations have been proposed, with significant attention being paid to the concentrating power of the lens or mirror. These solutions typically involve expensive coated glass surfaces. The weight of the components requires substantial mechanical actuators to move them so that they can accurately track the sun's motion across the sky. While functional, the prior art systems are expensive and complex. It would therefore be preferable to provide a solar concentrating device which can be made of inexpensive materials and which is relatively light and simple. The present invention proposes such a solution.

BRIEF SUMMARY OF THE INVENTION

The present invention is an inflatable solar energy collector. The device uses two elongated and pressure-stabilized air chambers with a trough-shaped reflecting surface in between. The curvature of the reflecting surface is created by adjusting the differential pressure between the two air chambers. The device can be configured to provide a focal point outside the air chambers or inside the air chambers. For the version using the external focal point an external energy receiver is appropriately positioned. For the version using the internal focal point, the receiver is mounted inside one of the air chambers.

The collector is preferably adjustable in azimuth to accurately track the sun's motion across the sky. It is able to operate efficiently without the need for altitude adjustment, although altitude adjustment may also be optionally provided. The invention preferably incorporates a novel energy receiver in which stagnant air is entrapped and used as an insulator. The invention may also feature the use of modular panels for the air chambers so that the walls of the air chambers may be easily replaced.

The curvature of the reflecting surface is optionally improved by the addition of one or more corrective bladders inflated to a pressure between that in the two air chambers. The corrective bladders cause the reflecting surface to more closely approximate the shape of a parabola.

BRIEF DESCRIPTION OF THE SEVERAL VIEWS OF THE DRAWINGS

FIG. 1B is an exploded perspective view, showing the three layers used to make the desired structure.

Figure 1:
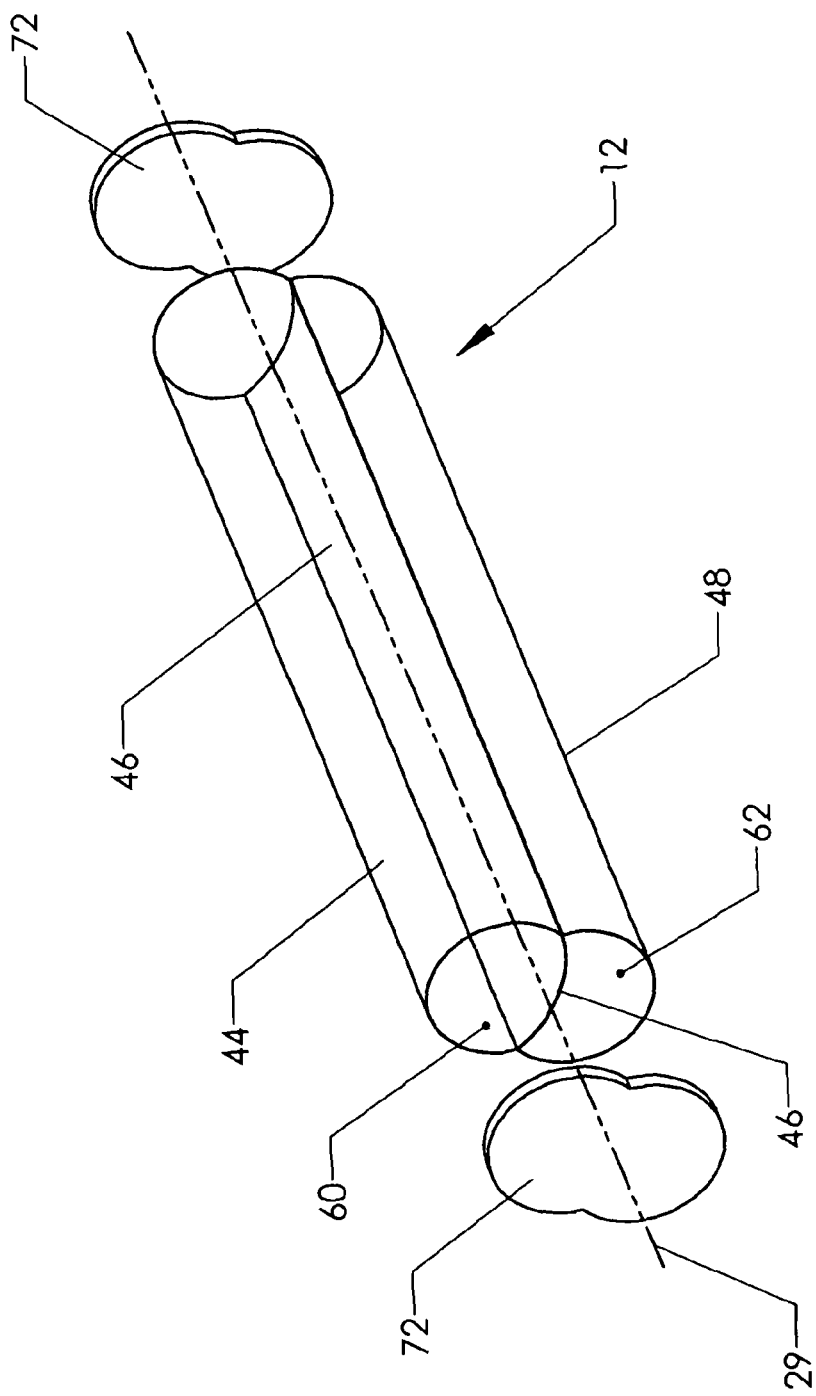
FIG. 1 is an exploded perspective view, showing a solar collector made according to the present invention.

| REFERENCE NUMERALS IN THE DRAWINGS | | | |
|---|---|---|---|
| 12 | inflatable trough reflector | 14 | frame |
| 15 | altitude pivot joint | 17 | azimuth pivot joint |
| 19 | wheel | 21 | pressure line |
| 23 | pressure differential controller | 25 | end support |
| 27 | receiver | 29 | central axis |
| 31 | turntable | 33 | receiver tube |
| 35 | tube channel | 37 | insulator block |
| 39 | working fluid | 41 | side wall |
| 43 | pivoting receiver mount | 44 | clear layer |
| 45 | end plate | 46 | middle reflective layer |
| 47 | entrapped region | 48 | back layer |
| 49 | corrective bladder | 51 | bladder layer |
| 53 | flattened region | 55 | first corrective bladder |
| 57 | second corrective bladder | 59 | first bladder layer |
| 60 | reflector chamber | 61 | second bladder layer |
| 62 | back chamber | 63 | vent |
| 65 | bladder layer | 67 | first bladder bulkhead |
| 69 | second bladder bulkhead | 71 | top bracket |
| 72 | end closure | 73 | side bracket |
| 74 | area of focus | 75 | bottom bracket |
| 76 | incoming ray | 77 | split clear layer |
| 78 | reflected ray | 79 | split back layer |
| 80 | second junction | 81 | first junction |
| 82 | first edge | 83 | second edge |
| 84 | third edge | 85 | fourth edge |

DETAILED DESCRIPTION OF THE INVENTION

FIG. 1 shows the major components of the present invention in an exploded view. Inflatable trough reflector 12 is preferably a long and slender assembly aligned with central axis 29. It may be much longer than the version illustrated. The invention is preferably made by joining thin and flexible films together. The embodiment of FIG. 1 has three such films—clear layer 44, middle reflective layer 46, and back layer 48.

The films are typically made of plastic. Clear layer 44 should be optically transparent. Middle reflective layer 46 is coated with a reflective substance on the side facing upward in the view. Back layer 48 may be opaque, though as it is convenient to use the same material for the clear layer and the back layer it may be clear as well.

FIG. 1B is an exploded view of the three layers prior to their assembly. Each layer is made of a rectangular sheet of film. Each has a first edge 82, second edge 83, third edge 84, and fourth edge 85. The first and third edges of all layers are parallel to central axis 29. Returning to FIG. 1, the reader will observe that the first edges of all three layers have been joined together into a three-way union. Likewise, the third edges of all three layers have been joined together into a three-way union.

This construction forms two separate chambers—reflector chamber 60 and back chamber 62. The two chambers are separated by middle reflective layer 46. Of course, the layers are preferably too thin to form the stable structure illustrated on their own. The two chambers must be internally pressurized to create a stable structure. In order to do this, the open ends of the two chambers must be closed. Two end closures 72 may be used for this purpose. The second and fourth edges of each layer are sealed to the end closures so that reflector chamber 60 and back chamber 62 are segregated from the ambient environment and from each other. The reader should note that the end closures can assume many forms, including simply clamping the three layers together into a seam at each end and sealing the seam.

Once sealed, the pressure within the two chambers is increased to a level needed to stabilize the thin film structure. This pressure will depend upon the size of the embodiment, the film thicknesses used, etc. However, for an embodiment having a length of about 3 meters along the central axis, an internal pressure of about 0.01 to 0.05 atmospheres atmospheres above ambient pressure in reflector chamber 60 is sufficient.

The pressure within back chamber 62 is set at a lower level than the pressure within reflector chamber 60. The pressure difference causes middle reflective layer 46 to deflect toward back chamber 62—as shown in the views. Middle reflective layer 46 thereby assumes the shape of a "trough reflector." The shape assumed is very nearly cylindrical.

Figure 2:
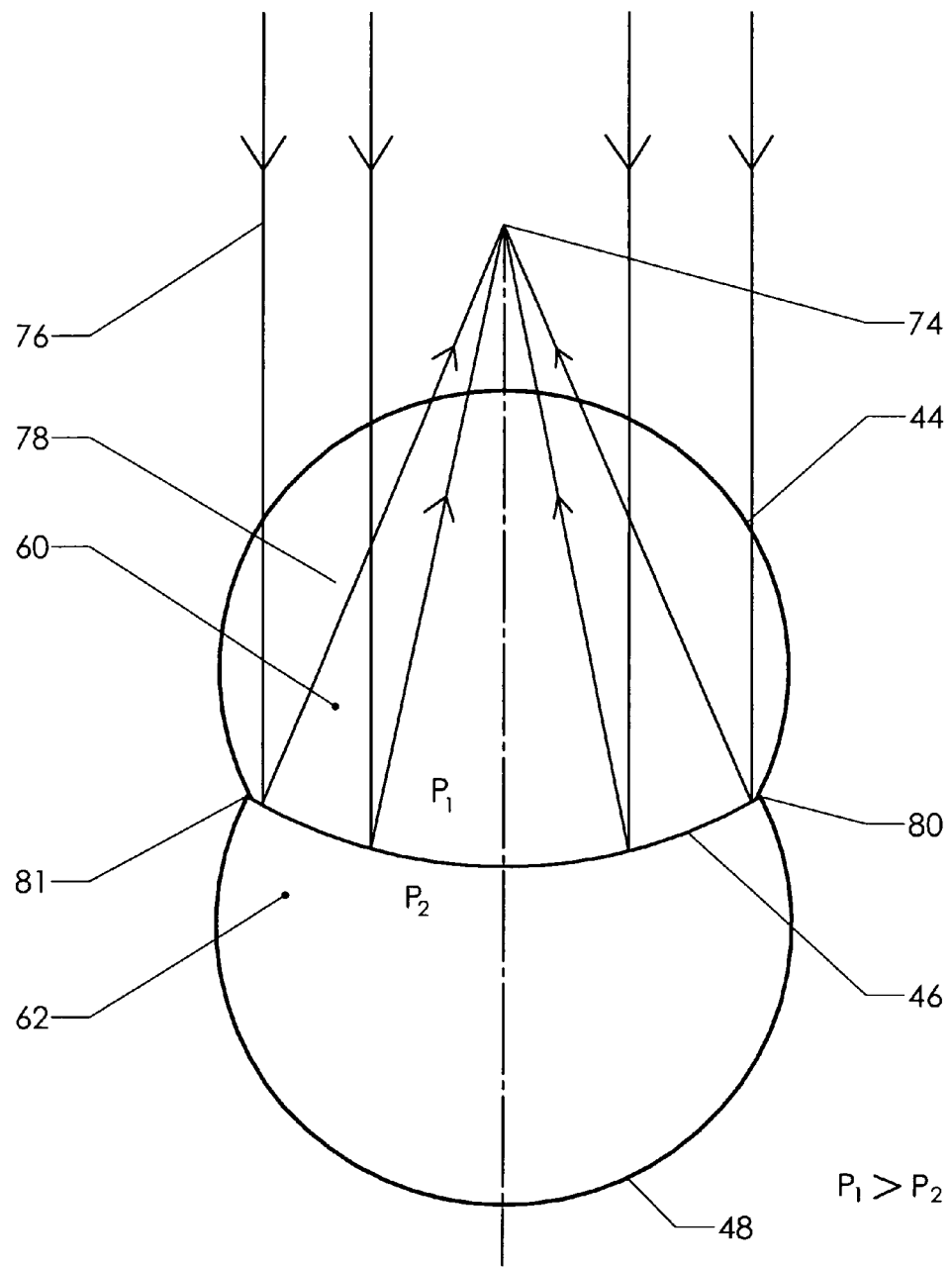
FIG. 2 is a sectional elevation view, showing the operation of the collector.

FIG. 2 is a sectional elevation view through the reflector, illustrating its operation. As discussed previously, the first edges of all three layers are joined at first junction 81. The third edges of all three layers are joined at second junction 80. These two junctions run substantially parallel to central axis 29.

The reflector focuses incoming parallel rays—such as solar rays. Incoming rays 76 pass through clear layer 44 and are reflected by middle reflective layer 46 to form reflected rays 78. The rays then converge on area of focus 74. Those skilled in the art will know that the ideal shape for focusing parallel rays into a line is a trough reflector having a parabolic cross section. As the middle reflective layer is closer to being cylindrical, some error in the focusing is present. Thus, the term "area" of focus is used.

Those skilled in the art will also realize that the incoming rays are refracted as they pass through clear layer 44 and that this refraction will vary depending upon the angle of incidence for a particular ray. However—as clear layer 44 is preferably very thin—the effect of the refraction is negligible.

In studying FIG. 2, the reader will note that varying the curvature of the middle reflective layer will vary the location of area of focus 74. As mentioned previously, the curvature is created by a differential pressure between reflector chamber 60 and back chamber 62. Thus, by varying this differential pressure one may focus the collector on a desired distance. As the second and fourth edges of the middle reflective layer must be attached to the end closures, it is preferable to vary the pressure differential—and consequent curvature of the middle layer—over a relatively small range.

Figure 3:
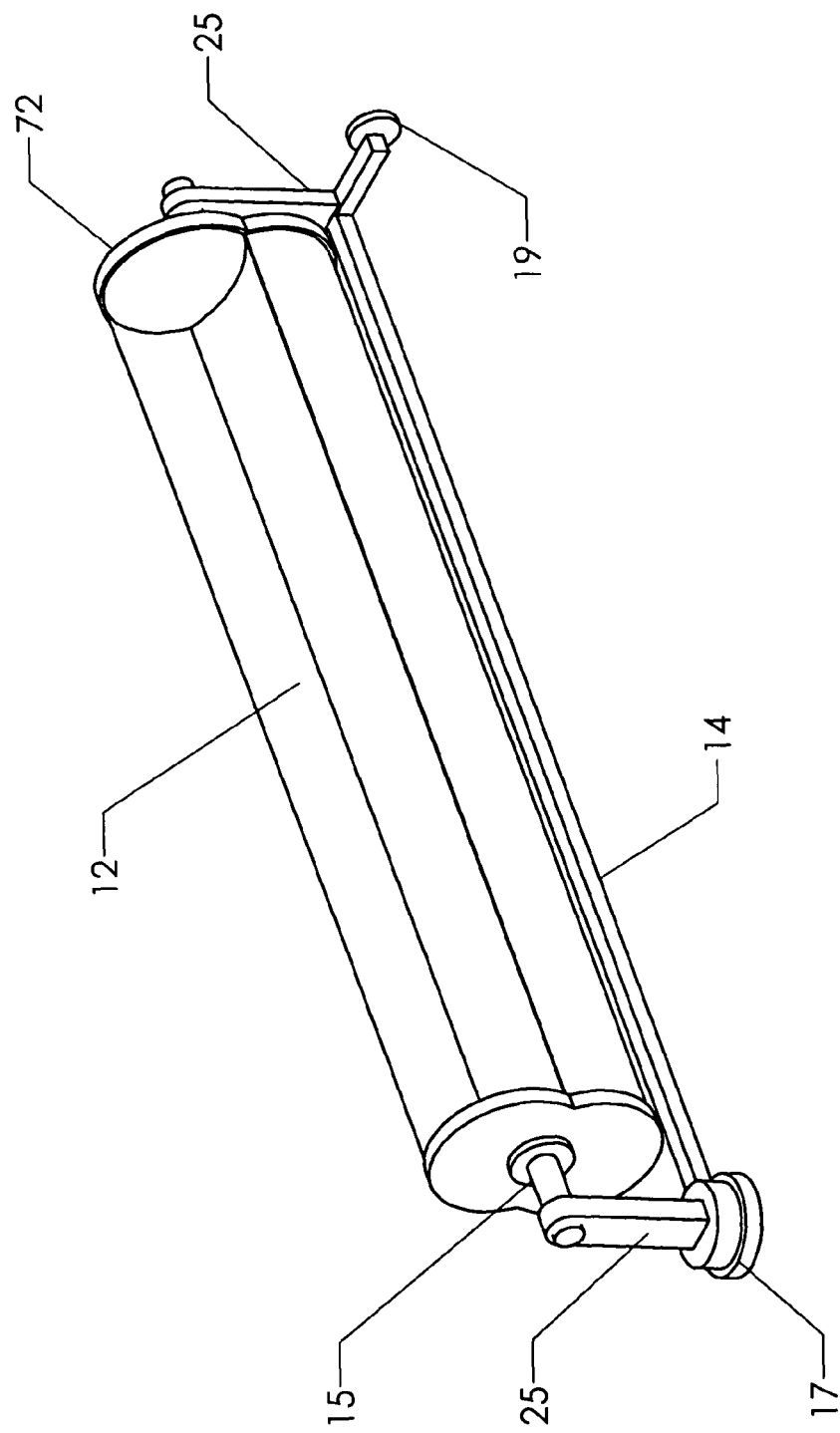
FIG. 3 is a perspective view, showing the mounting of the collector in a frame.

It is useful to provide the reflector assembly with a mounting frame to facilitate support and proper orientation. This mounting frame could assume an endless variety of forms. FIG. 3 shows one example. Frame 14 includes two end supports 25 which are attached to end closures 72. The frame optionally includes azimuth pivot joint 17, which allows the entire assembly to swivel in the horizontal plane in order to track the motion of the sun. One or more wheels 19 can be provided on the end support opposite the azimuth pivot joint in order to make the assembly easier to move.

The connection between the two end supports 25 and the two end closures 72 optionally includes a pair of altitude pivot joints 15. These allow the reflector to pivot along an axis parallel to central axis 29. As will be explained subsequently, the collector can perform quite well without the inclusion of the altitude pivot joints.

Figure 4:
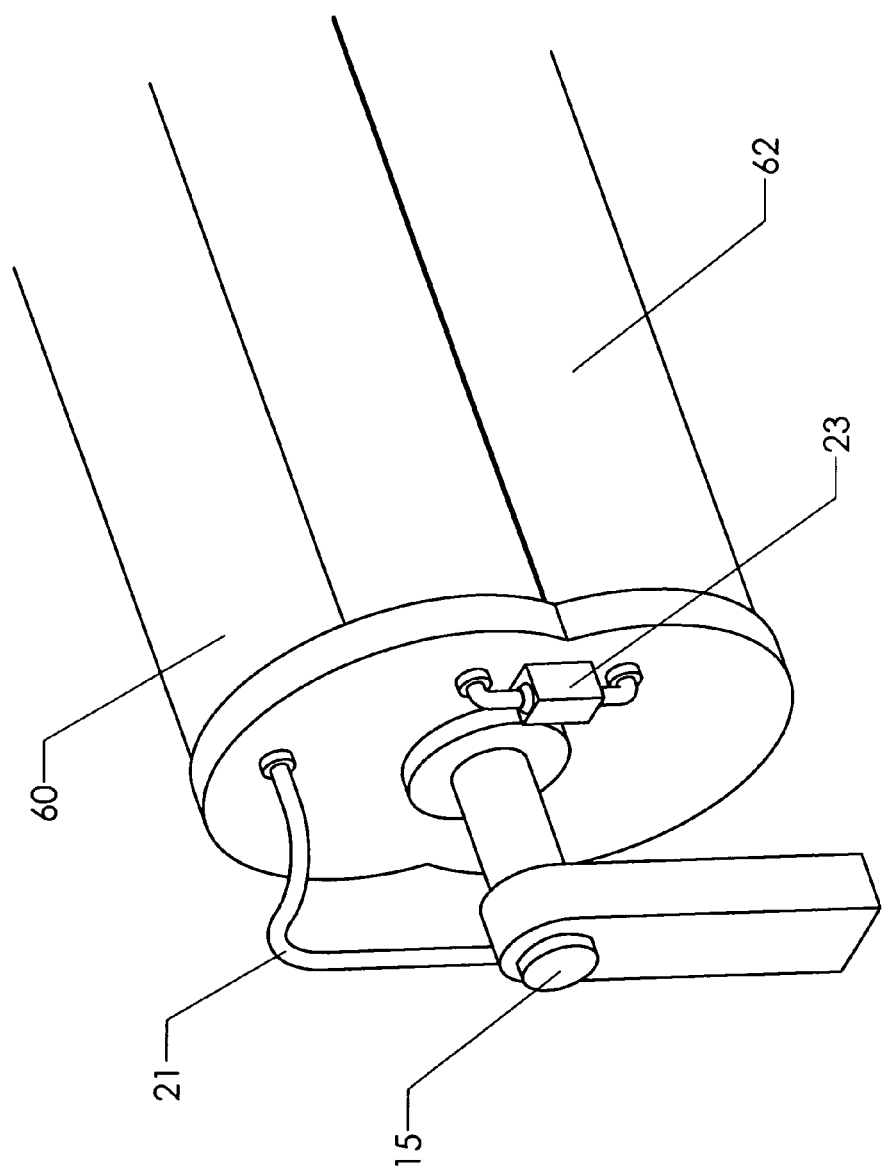
FIG. 4 is a detailed perspective view, showing one of the end plates.

FIG. 4 shows a detail view of one of the end closures 72. Pressure line 21 feeds pressurized air (or some other gas) into reflector chamber 60. A second feed line can be used to pressurize back chamber 62. Alternatively, the back chamber can be connected to the reflector chamber using a pressure reducing valve. Such a valve can be associated with a pressure differential controller 23, which is fluidly connected to both chambers as shown. This controller preferably includes a controllable vent or vents allowing some of the pressure within the back chamber to be vented. In this way, the pressure differential controller is able to adjust the differential pressure between the two chambers and thereby "fine tune" focus the middle reflective layer as desired.

Figure 5A:
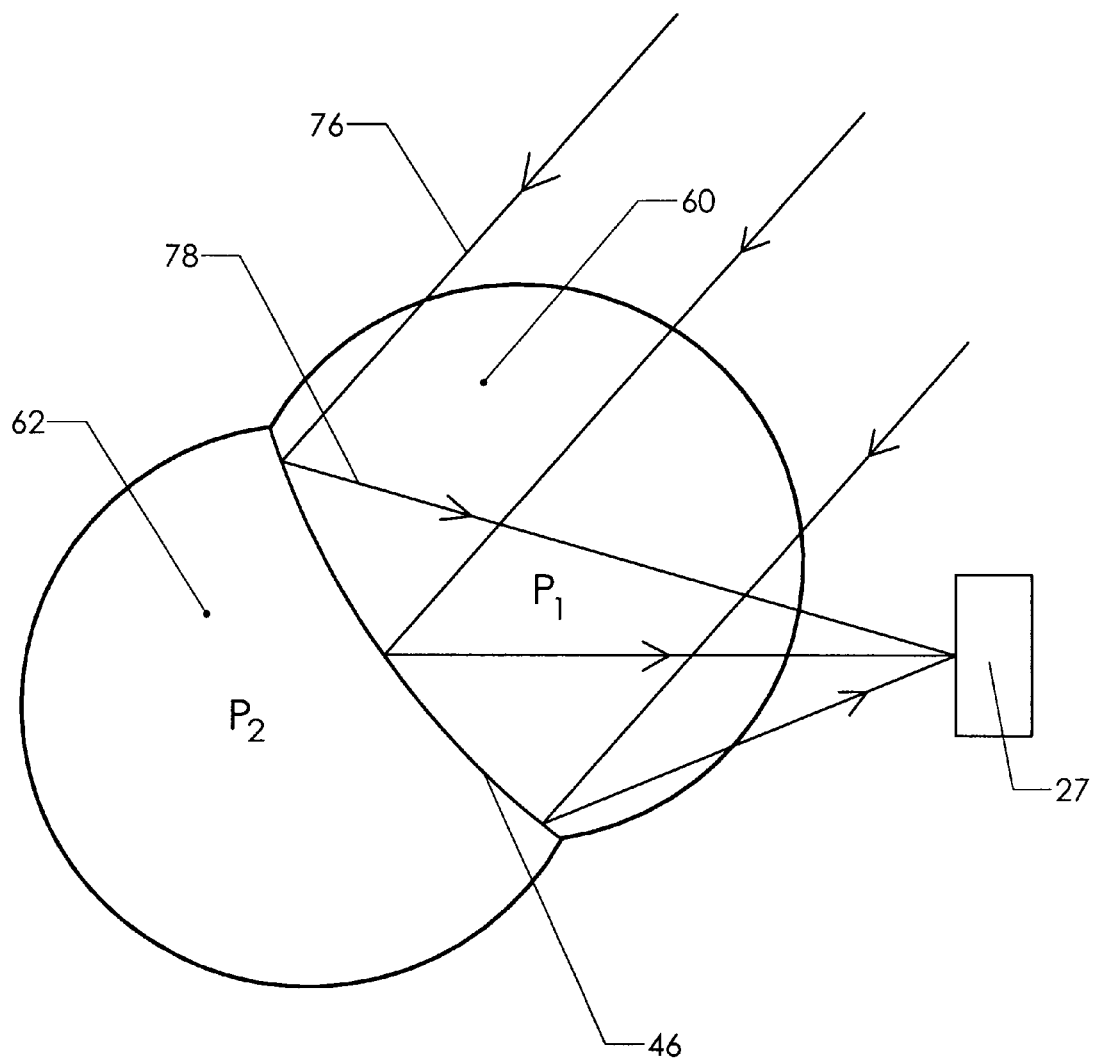
FIG. 5 is a sectional elevation view, showing the production of internal versus external focus.

FIG. 5 shows two possible applications for the focusing reflector. In FIG. 5A, middle reflecting layer 46 is set to a relatively shallow curvature so that the area of focus is established outside the reflector. Receiver 27 (which may be a photovoltaic cell or other type of solar energy receiver) is positioned at the area of focus. The focus can of course be "fine tuned" by adjusting the differential pressure. In this version, the reflector is rotated about the altitude axis in order to laterally reflect the incoming rays. It is also possible to place receiver 27 directly in front of the reflector.

Figure 5B:
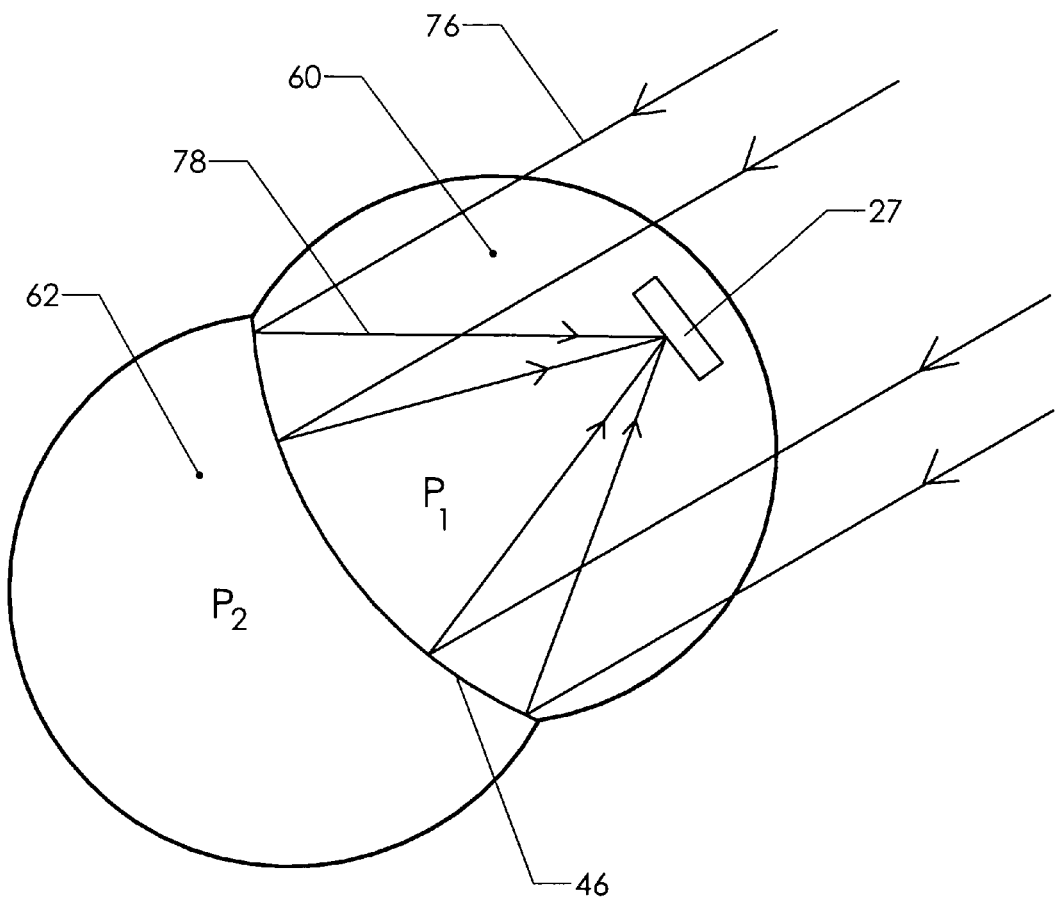

FIG. 5(B) shows an embodiment in which the curvature of the middle reflective layer is increased to place the area of focus inside reflector chamber 60. In this version receiver 27 is actually placed inside the reflector chamber and moves with the rest of the assembly.

Figure 6:
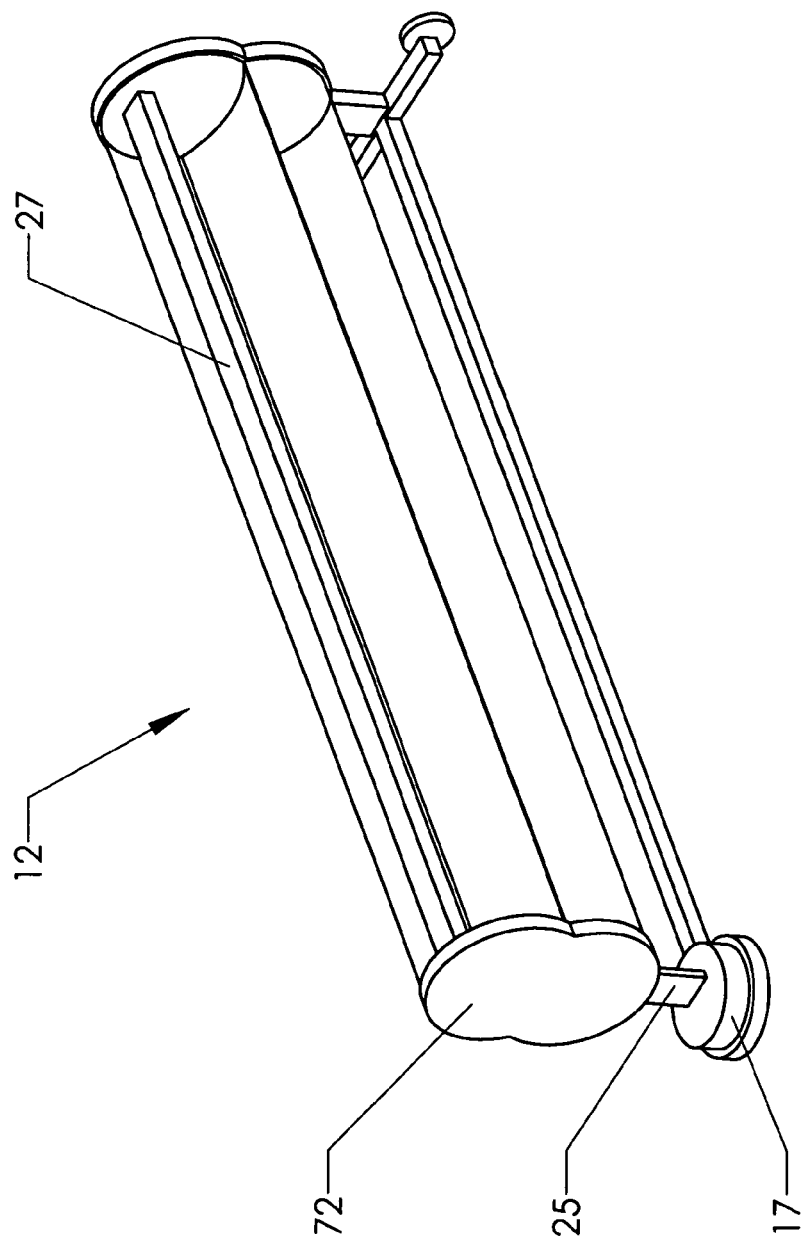
FIG. 6 is a perspective view, showing a mounting having only azimuth tracking.

Both versions of FIG. 5 show the reflector pivoting about the altitude axis to track the sun. One objective of the present invention is to reduce cost and complexity. It is therefore desirable to eliminate the need for an altitude axis pivot joint. The invention is able to do this while still maintaining good efficiency. FIG. 6 shows an embodiment retaining azimuth pivot joint 17 but lacking an altitude pivot joint. The reflector remains at all times in a horizontal and upright position. The only tracking feature is to pivot the assembly about azimuth pivot joint 17.

Figure 7:
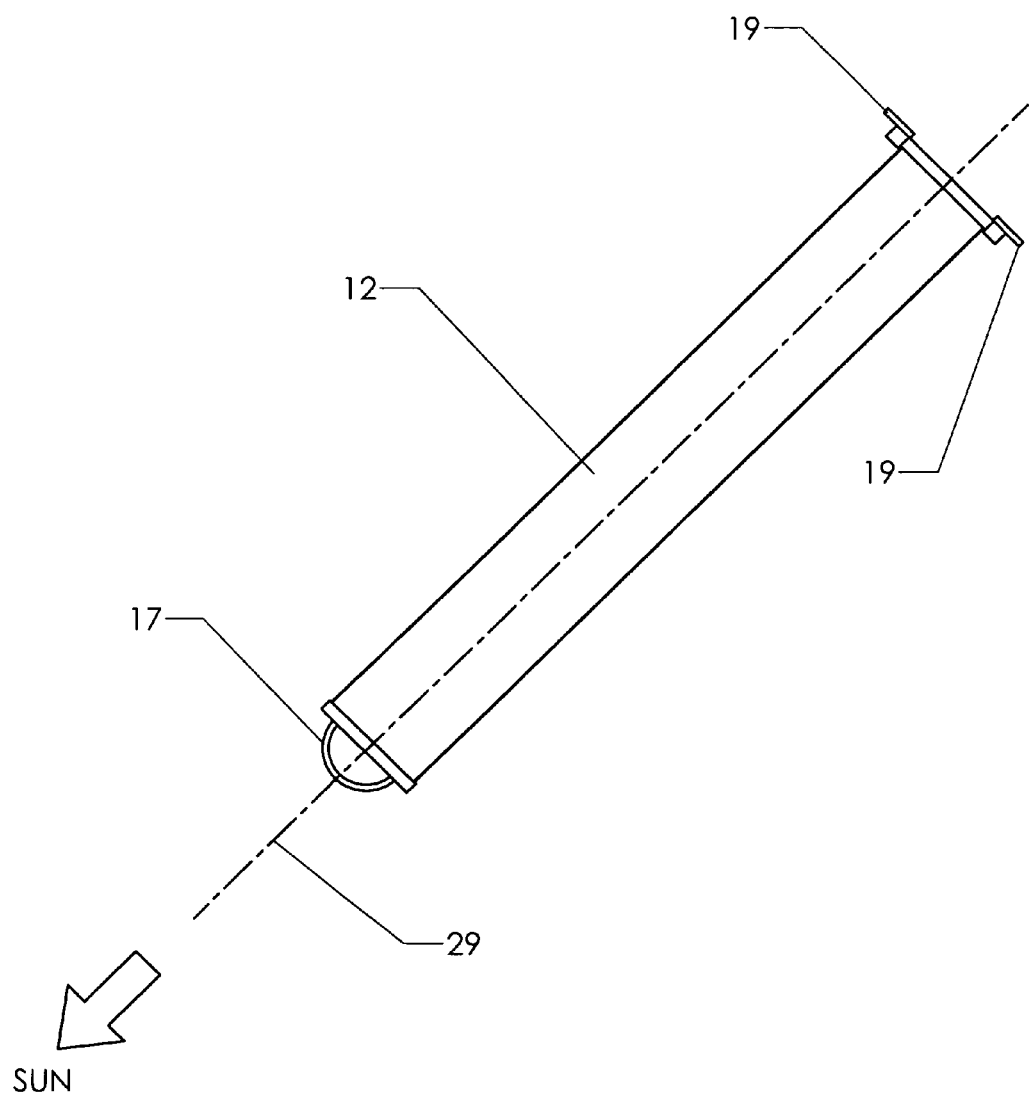
FIG. 7 is a plan view, showing the use of the azimuth pivot joint to track the sun.
Figure 8:
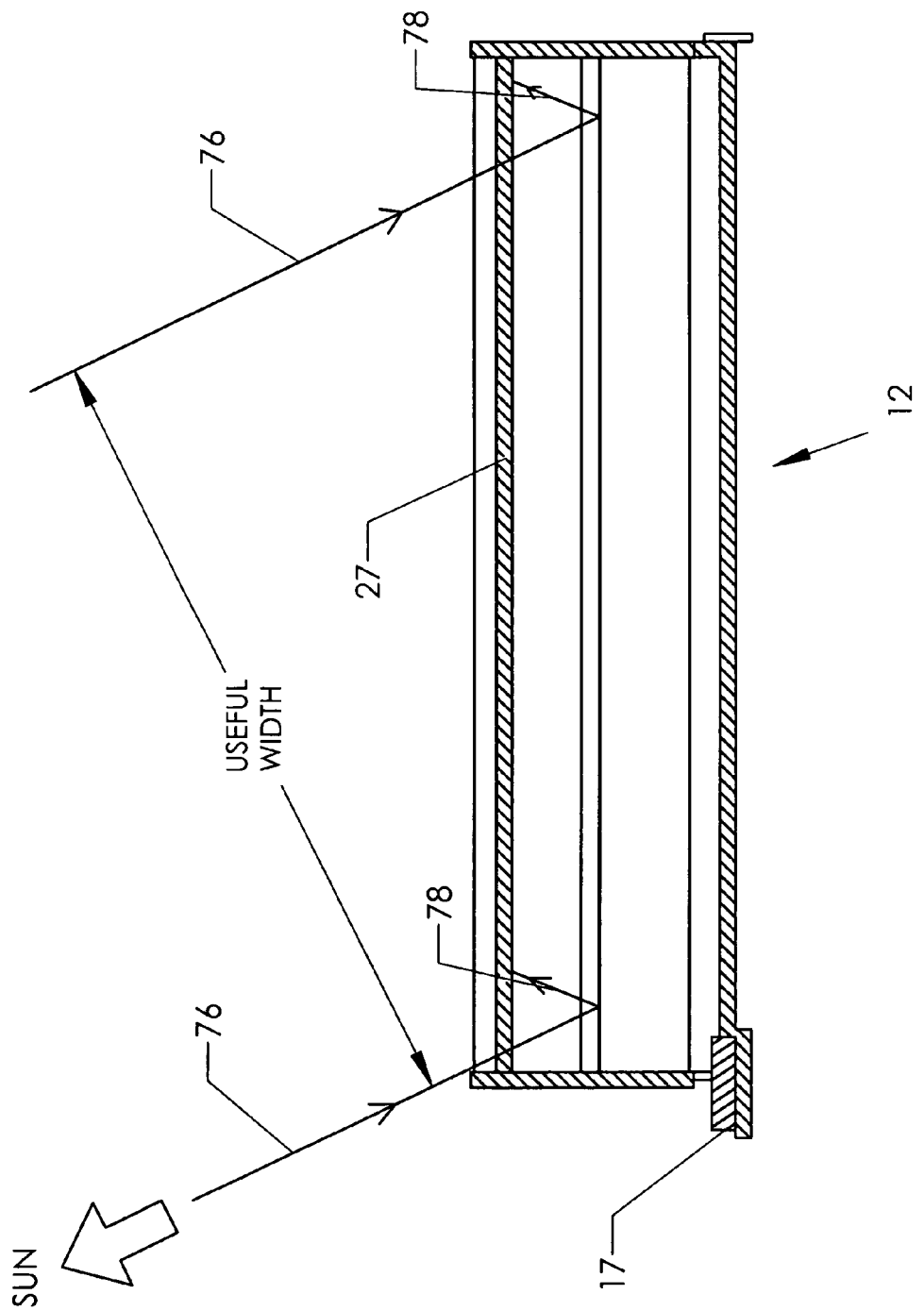
FIG. 8 is an elevation view, showing the use of the azimuth pivot joint to track the sun.

FIG. 7 shows a plan view of the same assembly. The reflector is pivoted about the azimuth pivot joint until central axis 29 is aligned with the azimuth of the sun. FIG. 8 shows the same configuration in an elevation view. At any given instant during daylight hours, the sun lies above the horizon along a vector corresponding in the view to incoming ray 76. The angle between this vector and the horizon is known as the sun's "altitude" ("Altitude" is the terminology used in traditional celestial navigation. The term is now used by many persons in the field of solar energy. In this context it refers to an angle and not a linear dimension).

Incoming ray 76 is reflected by the trough-shaped middle reflecting layer to form reflected ray 78. In this embodiment the focal length is preferably set to have the area of focus located near the top of the reflector chamber so that it focuses on receiver 27. A lower altitude to the sun increases the required effective focal length as shown in the view (If the sun were directly overhead this would produce the shortest required focal length).

Those skilled in the art will realize that a trough reflector produces a "line focus," meaning that the focus is a bright line rather than a single point. As the sun's altitude decreases, some of the incoming rays are blocked by one of the end closures. Thus, the "useful width" of incoming rays is reduced. The entire width may only be harvested when the sun is directly overhead.

It is useful to contemplate the motion and operation of the device as the sun transits the sky. Returning to FIG. 7, the sun's azimuth at sunrise will be to the east. In the northern hemisphere, a typical azimuth at sunrise could be 97 degrees (with 0 degrees being true north). At this time the sun's altitude will be very low and the "useful width" as shown in FIG. 8 may well be zero.

At local noon the sun's azimuth will be 180 degrees. At 30 degrees north latitude in the spring this will correspond to an altitude of around 68 degrees. The useful width at this point will be substantial. In studying FIG. 8, those skilled in the art will realize that the focal length of the trough reflector varies as the sun's altitude changes. As the sun's altitude declines, the focal length will be longer. However, inherent in the design of a trough reflector is the fact that the "line focus" will remain constant on the area of receiver 27 (assuming it is set up that way to begin with). It will simply shift left or right in the orientation shown in the view. Of course, the pressure differential between the two chambers can always be used to fine tune the focus. The reader will thereby understand that the present invention can track the sun and achieve good efficiency using only an azimuth pivot joint. Of course, an altitude pivot joint can be added so that the useful width is always maximized, but this will add complexity and cost and may not be worthwhile in many applications.

Figure 9:
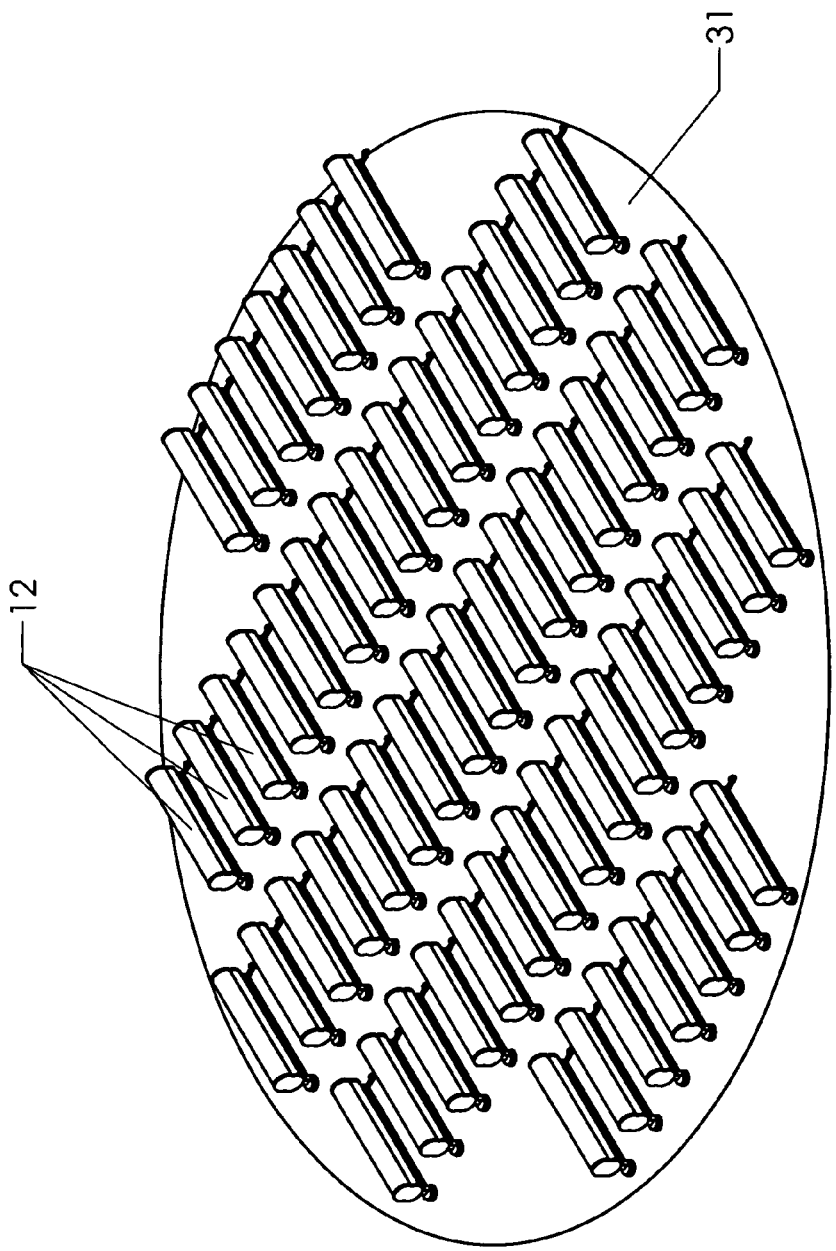
FIG. 9 is a perspective view, showing an array of collectors mounted on a turntable.

The use of a configuration having only an azimuth pivot joint is especially advantageous where a large array of collectors is desired. FIG. 9 shows an array of inflatable trough collectors 12 which include internal receivers. As these collectors only need to be adjusted in azimuth, they are all fixedly mounted to turntable 31 with their central axes 29 aligned. Turntable 31 rotates through the daylight hours so that the central axes remain aligned with the sun's azimuth.

Such a turntable only needs to turn very slowly. One implementation would be to float a large array of such reflectors on a natural or artificial body of water. The flotation of the device would greatly reduce friction. The entire assembly could then be rotated slowly using drive means.

Figure 10:
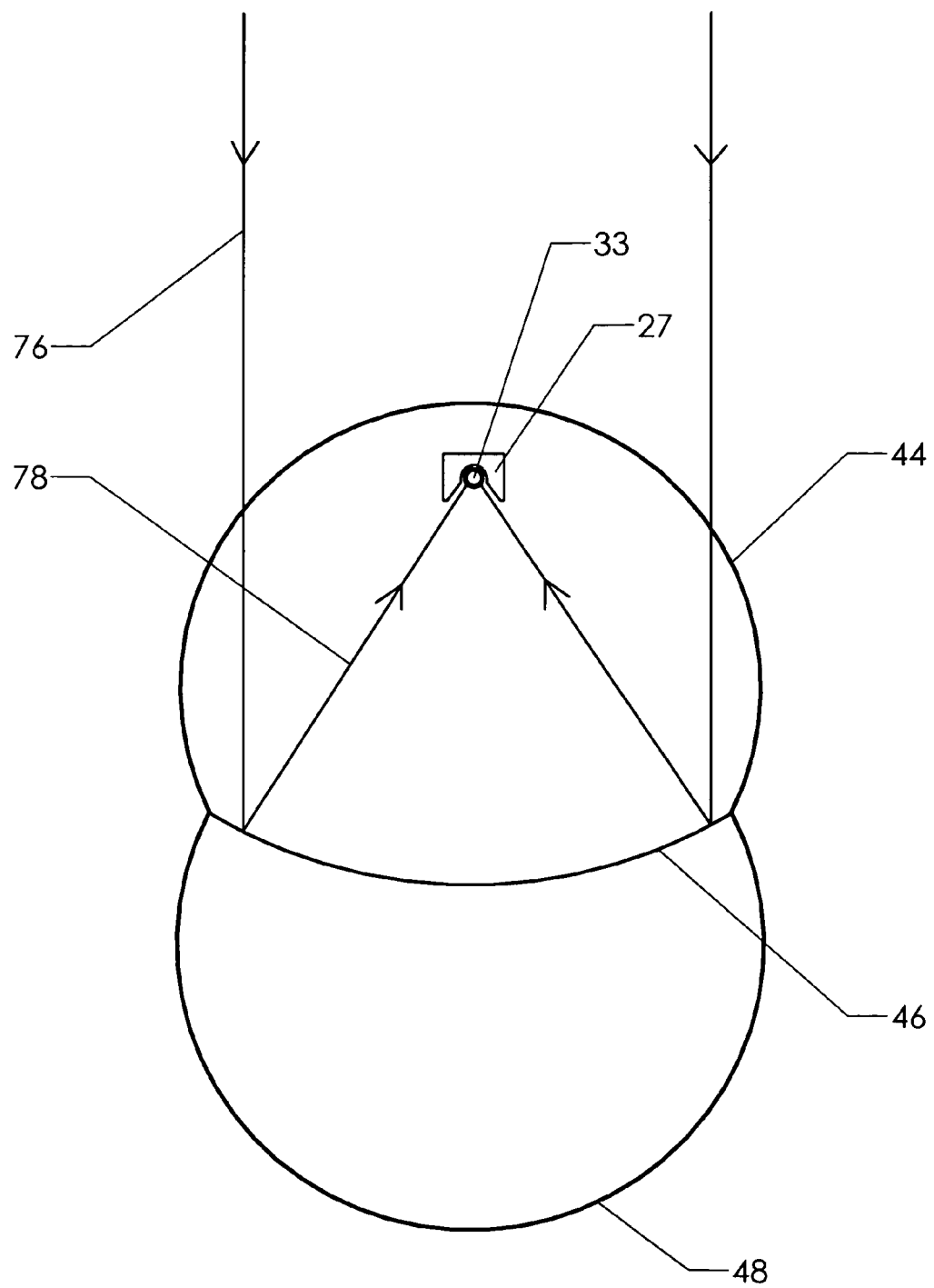
FIG. 10 is a sectional elevation view, showing some details of the internal receiver configuration.

The preferred embodiment of the device uses an internal receiver 27, as shown in FIG. 10. One approach is for the receiver to gather thermal energy which is used to heat a working fluid passing through the device. Receiver 27 contains receiver tube 33 which runs parallel to central axis 29. Receiver tube 33 contains a circulated working fluid (which could be a liquid or a gas). The wall of the receiver tube is thermally conductive in order to allow the heat generated by the line focus of the trough reflector to transfer to the working fluid.

Internal rifling, dimple patterns, and similar known techniques may be used to increase turbulence in the working fluid and thereby increase the heat transfer rate. The exterior of the receiver tube is often coated with suitable absorbing materials which also increase the heat transfer rate.

Figure 11:
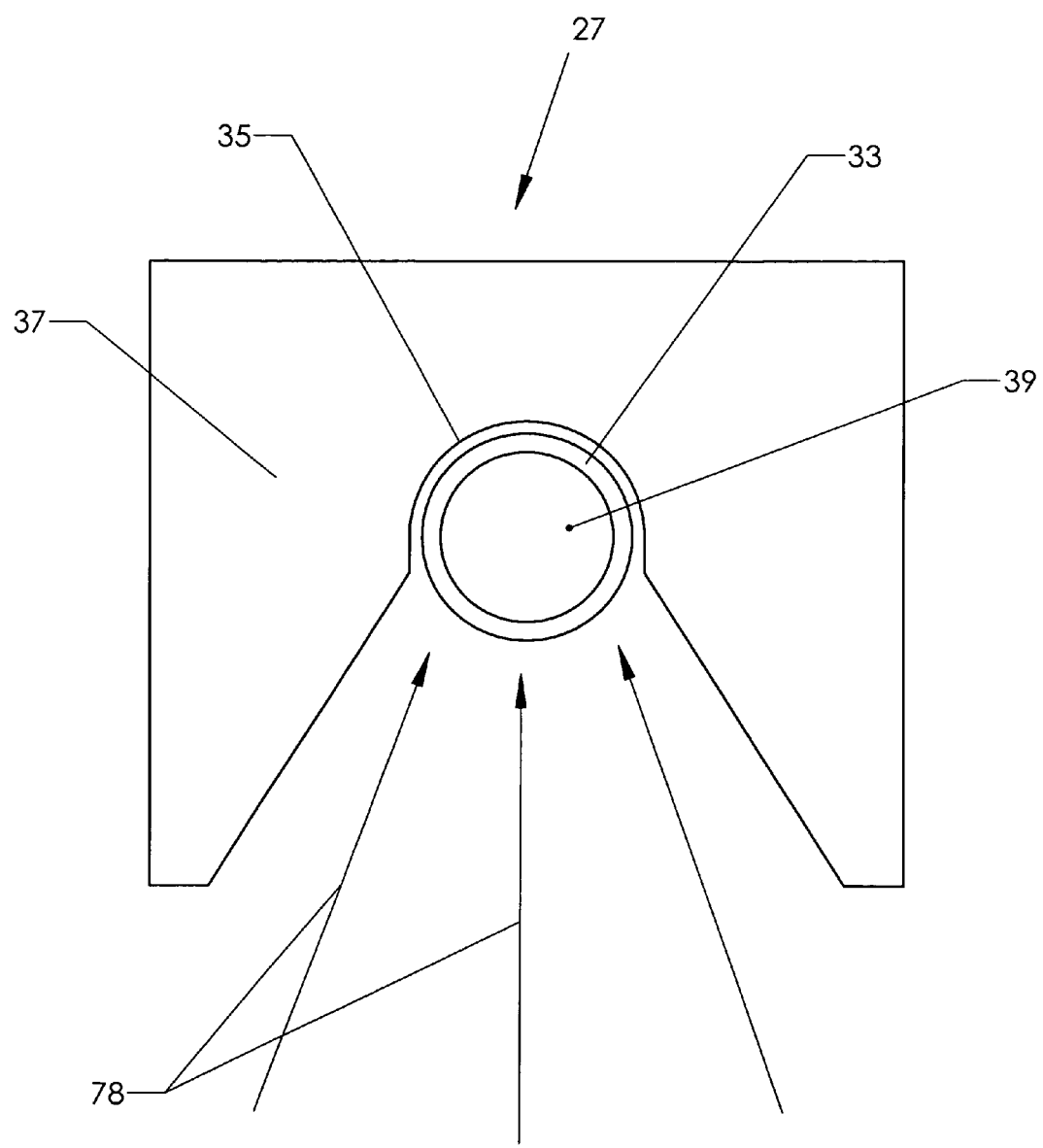
FIG. 11 is a sectional elevation view, showing the receiver.

FIG. 11 shows receiver 27 in more detail. The drawing shows a section through the receiver. The receiver is preferably quite long—running all or most of the length of the reflector chamber (though it may be comprised of shorter sections joined together). The general concept is to provide access to the portion of the receiver tube on which the sunlight will be focused while insulating the rest. Accordingly, most of receiver tube 33 is surrounded by insulator block 37. The insulator block is made from a good insulator having suitable mechanical strength and a sufficiently high melting temperature. Foamed glass is one suitable material.

Working fluid 39 is pumped through the receiver tube and is heated by reflected rays 78. It is desirable to maintain a high temperature around the receiver tube. In the prior art, this has been done by placing the receiver tube in an evacuated glass jacket. The present invention uses a less expensive and simpler approach.

The receiver in the preferred embodiment is contained within the sealed reflector chamber. The air within this chamber is stagnant, save for thermal effects. The insulator block shown in FIG. 11 is designed to take advantage of these conditions. The reader will observe that the downward facing part of the insulator block is open and the opening is bounded by descending side walls.

Figure 12:
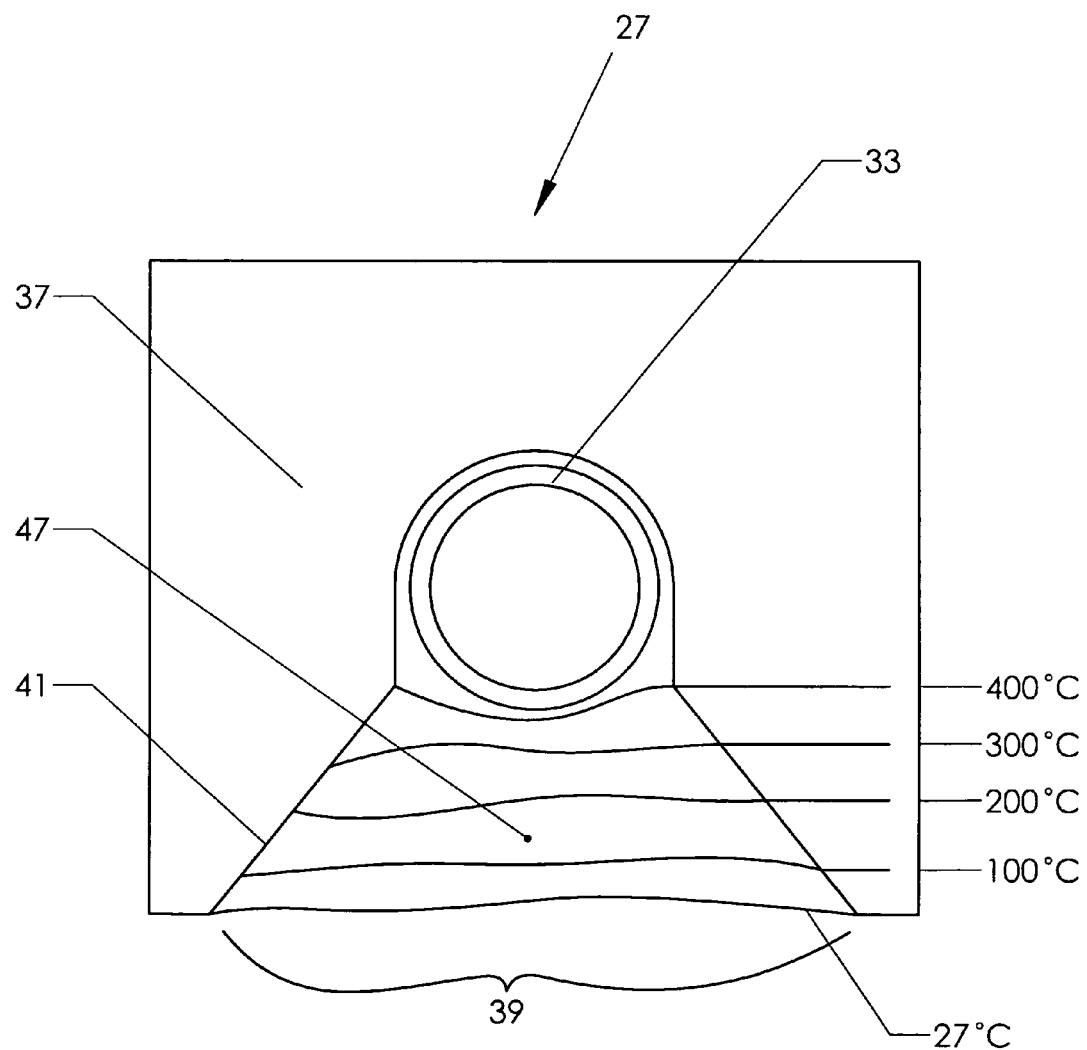
FIG. 12 is a sectional elevation view, showing the operation of the receiver.

FIG. 12 illustrates how the two descending side walls 41 create entrapped region 47 with opening 39 at the bottom.

Warmer air will naturally rise. The air closest to the area of focus on the receiver tube becomes heated. The air trapped within entrapped region 47 quickly stratifies as the sunlight is focused on the receiver tube. A tremendous temperature gradient results.

Figure 15:
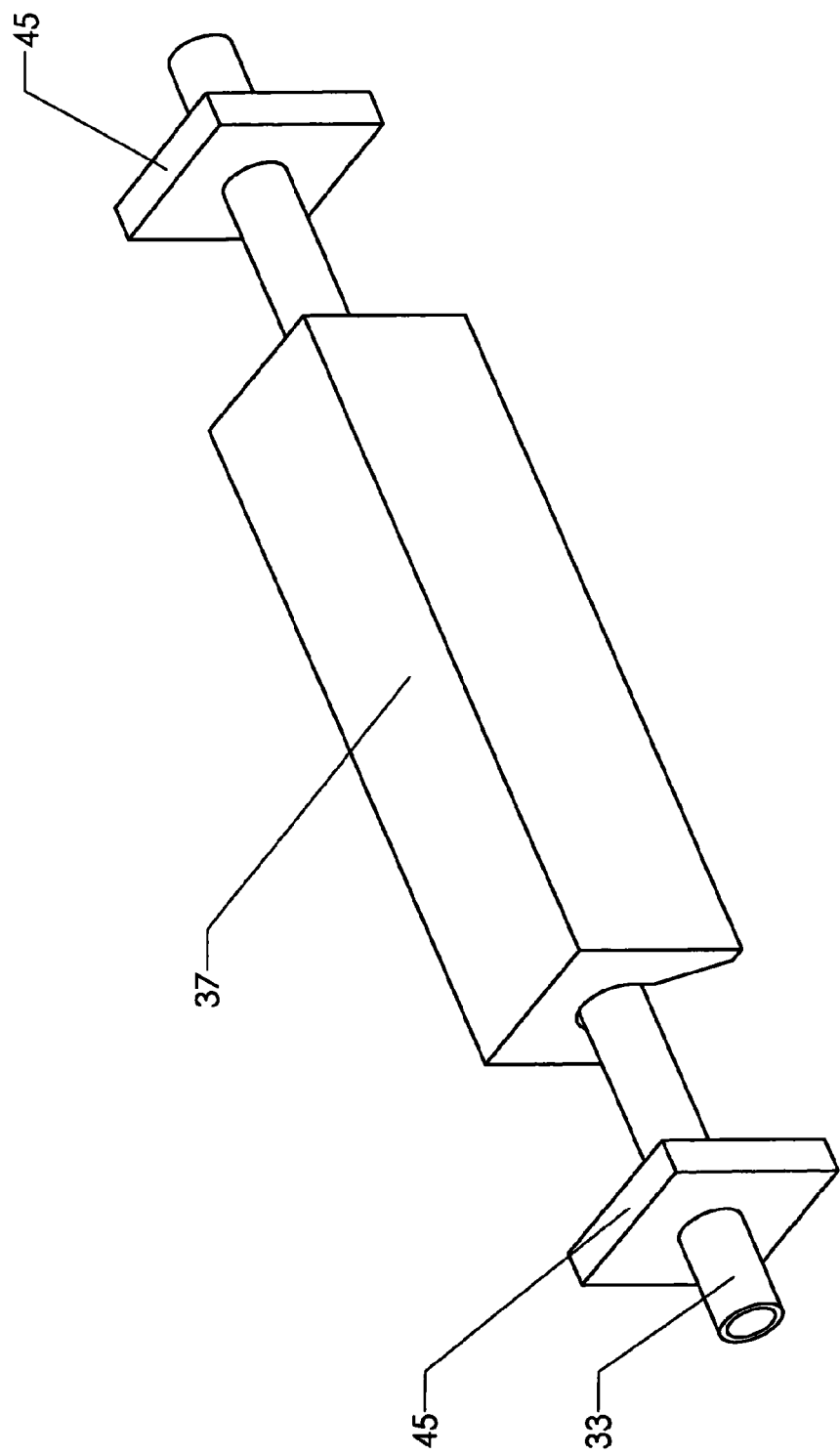
FIG. 15 is an exploded perspective view, showing the use of end plates to seal the ends of the receiver.

On a typical mild day, the air temperature within the reflector chamber is only 27 degrees Celsius (which is also the temperature at opening 39). The temperature proximate the receiver tube can climb to over 400 degrees Celsius. These two extremes may only be separated by about 5 cm. Turning briefly to FIG. 15, it is important to seal the open ends of the insulator block using end plates 45 (otherwise the heated air will rush out the ends). A receiver is typically made of a chain of three, four, or more insulator blocks 37 arrayed along receiver tube 33, with an end plate 45 on each end of the chain.

Figure 13:
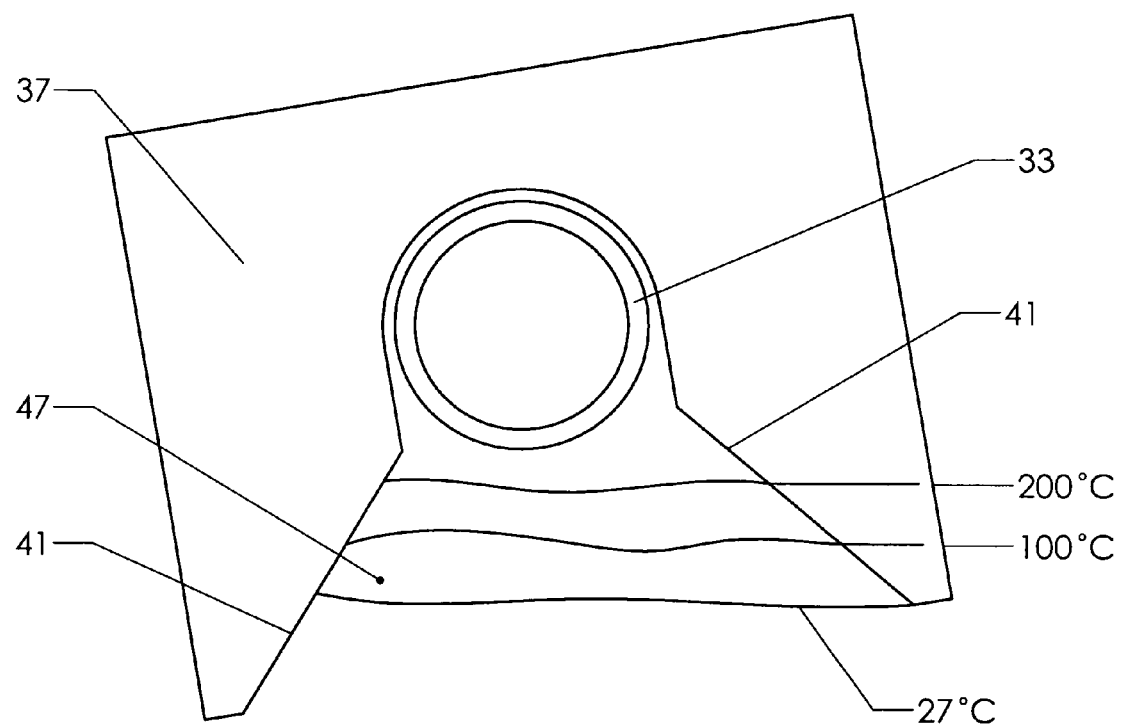
FIG. 13 is a sectional elevation view, showing the operation of the receiver.

Returning now to FIG. 12, the reader will appreciate that the stratified air within entrapped region 47 is captured by its own tendency to rise. Thus, very high temperatures can be achieved around the receiver tube. The phenomenon is still maintained when the receiver is tilted. FIG. 13 shows the receiver tilted about 15 degrees. This would occur if an altitude axis pivot joint is used on the collector and the collector is tilted 15 degrees off of vertical. The reader will observe that the stratified layers are still trapped within entrapped region 47. However, the layers are not as deep as the example of FIG. 12 and the ultimate temperature is somewhat reduced.

The receiver is applicable to reflector designs other than the one disclosed. It can, for example, be used as an external device exposed to ambient wind and convection. A modification is desirable, however. Looking at FIG. 12, the reader will appreciate that if the receiver is exposed to wind the shear will rapidly destroy the desired stratification of the air within entrapped region 47. This issue may be solved by covering opening 39 with a transparent cover. The receiver design could then achieve the desired stratification even when surrounded by moving air.

Figure 14A:
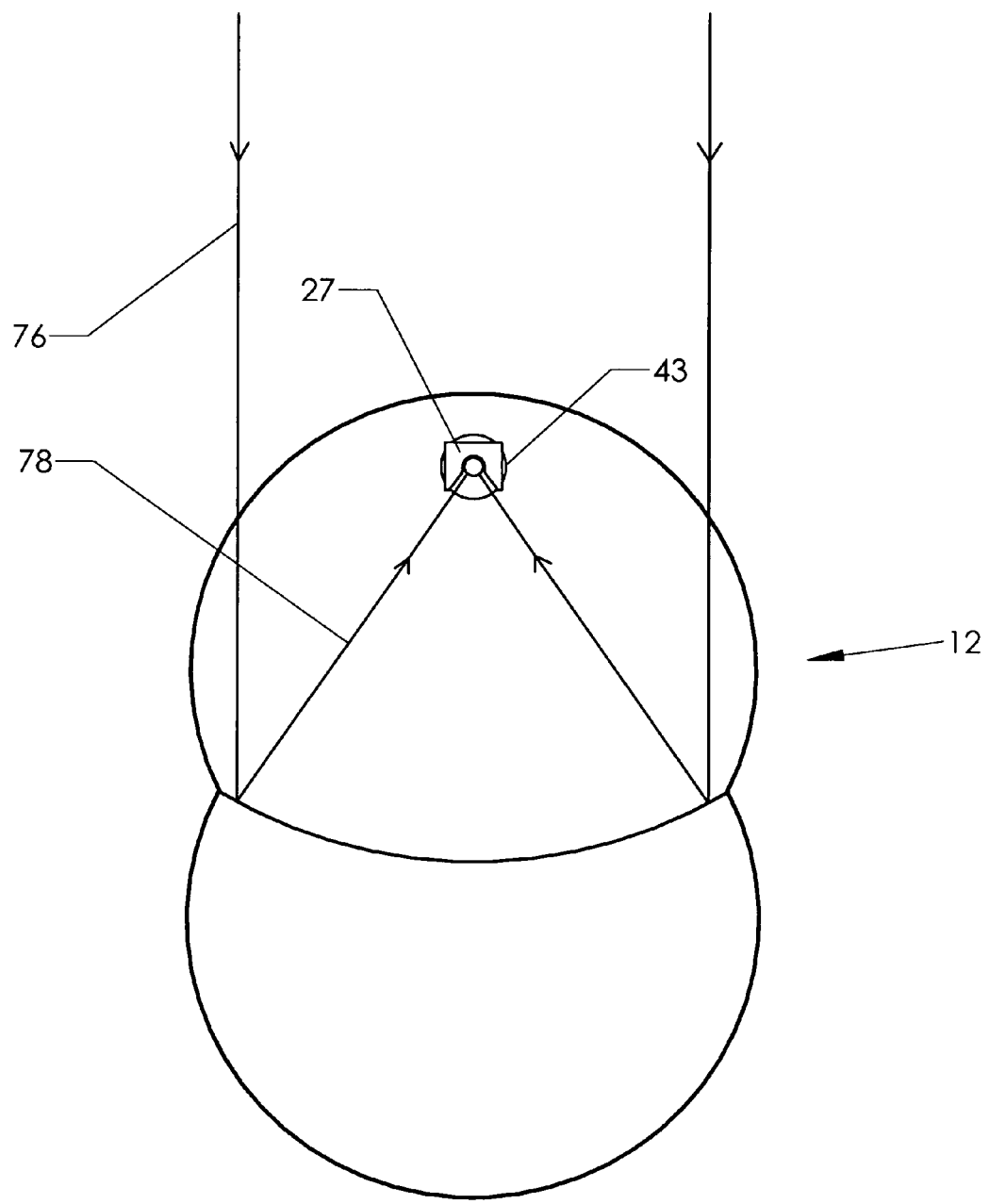
FIG. 14 is a sectional elevation view, showing the rotation of the receiver if the collector is rotated about the pitch axis.
Figure 14B:
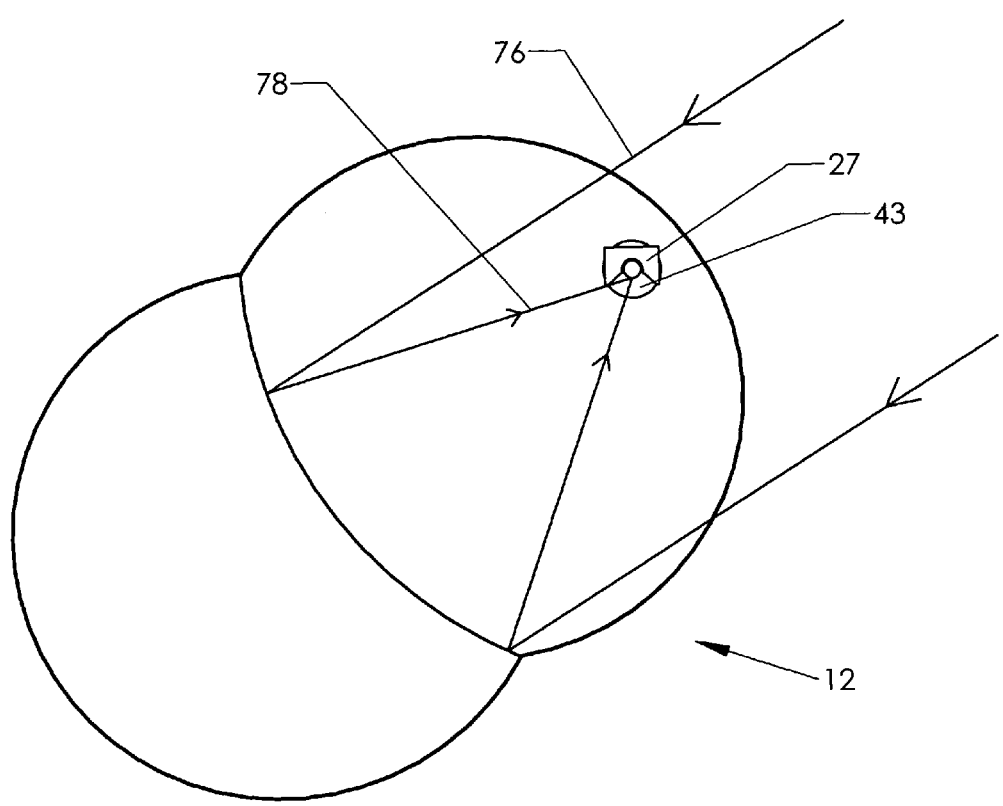

Looking at FIG. 13, one might well conclude that it is advantageous to independently tilt the receiver so that it remains vertical even when the reflector tilts along the altitude axis (assuming that the reflector has this capability). FIG. 14 shows an embodiment in which the receiver is independently tilted by pivoting receiver mount 43. In FIG. 14(A), receiver 27 is vertical and is aligned with the reflector. In FIG. 14(B), however, inflatable trough reflector 12 has been tilted about the altitude axis. Pivoting receiver mount 43 has pivoted in the opposite direction to retain receiver 27 in a vertical orientation.

The angled side walls 41 in the receiver are configured so that reflected rays 78 can still enter opening 39 even with the reflector being tilted with respect to the receiver. Of course, since the preferred embodiment does not include an altitude axis pivot joint, the pivoting receiver mount is unnecessary for the preferred embodiment. And—in fact—the tilting configuration is generally not advantageous. The maximum temperature is reached by surrounding as much of receiver tube 33 as possible with insulation. The angled gap between side walls 41 is preferably just wide enough to admit the available reflected rays—but no wider. The angle between the side walls must be widened to accommodate a tilting receiver, and this fact likely negates any advantage of the tilting receiver.

Figure 16:
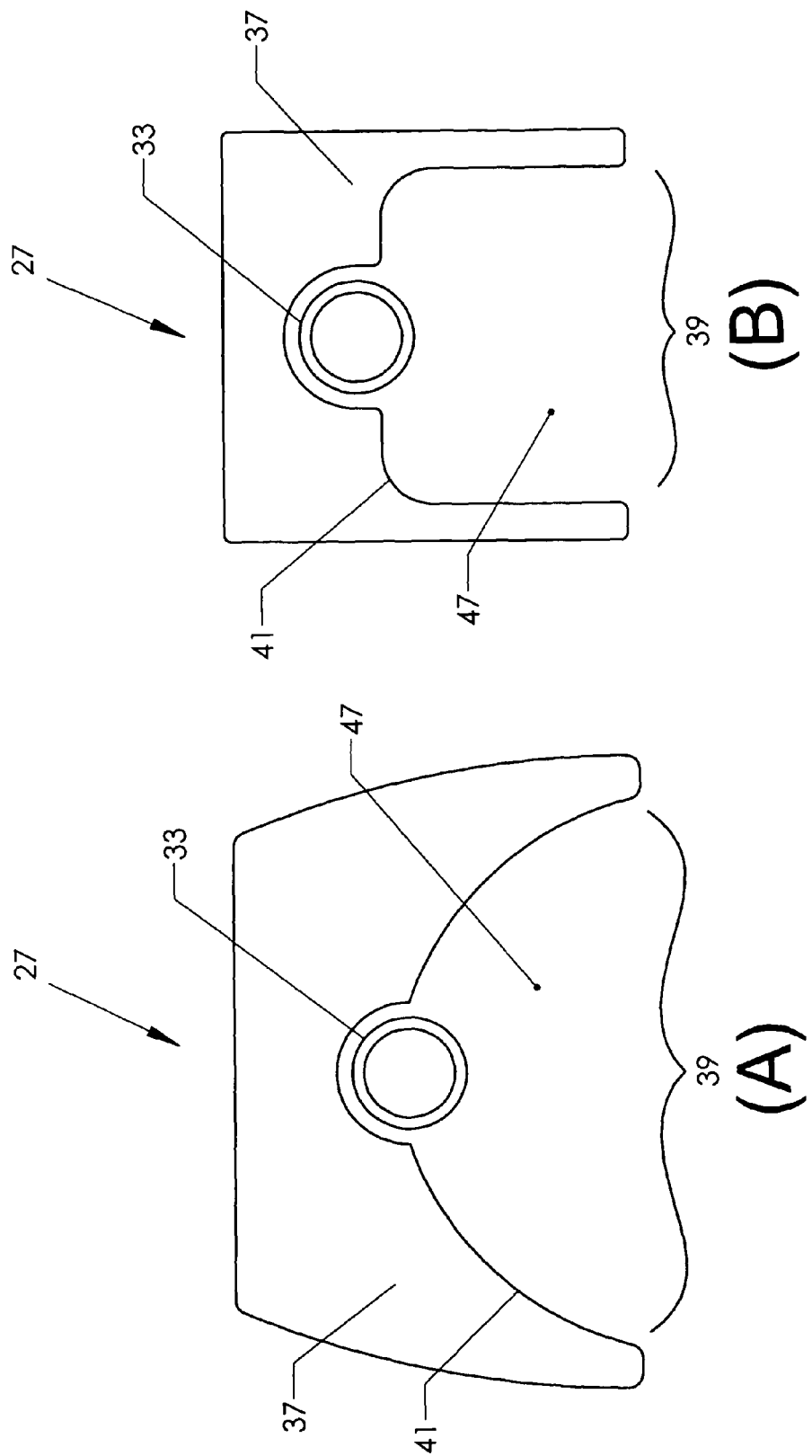
FIG. 16 is a sectional elevation view, showing alternate embodiments for the receiver.

The shape of the insulator block can be varied while still preserving the entrapment feature explained previously. FIG. 16 shows two examples of shape variations. In FIG. 16(A), side wall 41 is curved. In FIG. 16(B), the side wall has a rectangular shape. Both include opening 39 and both will entrap the air within entrapped region 47, though the shape may be less than optimum.

Figure 17:
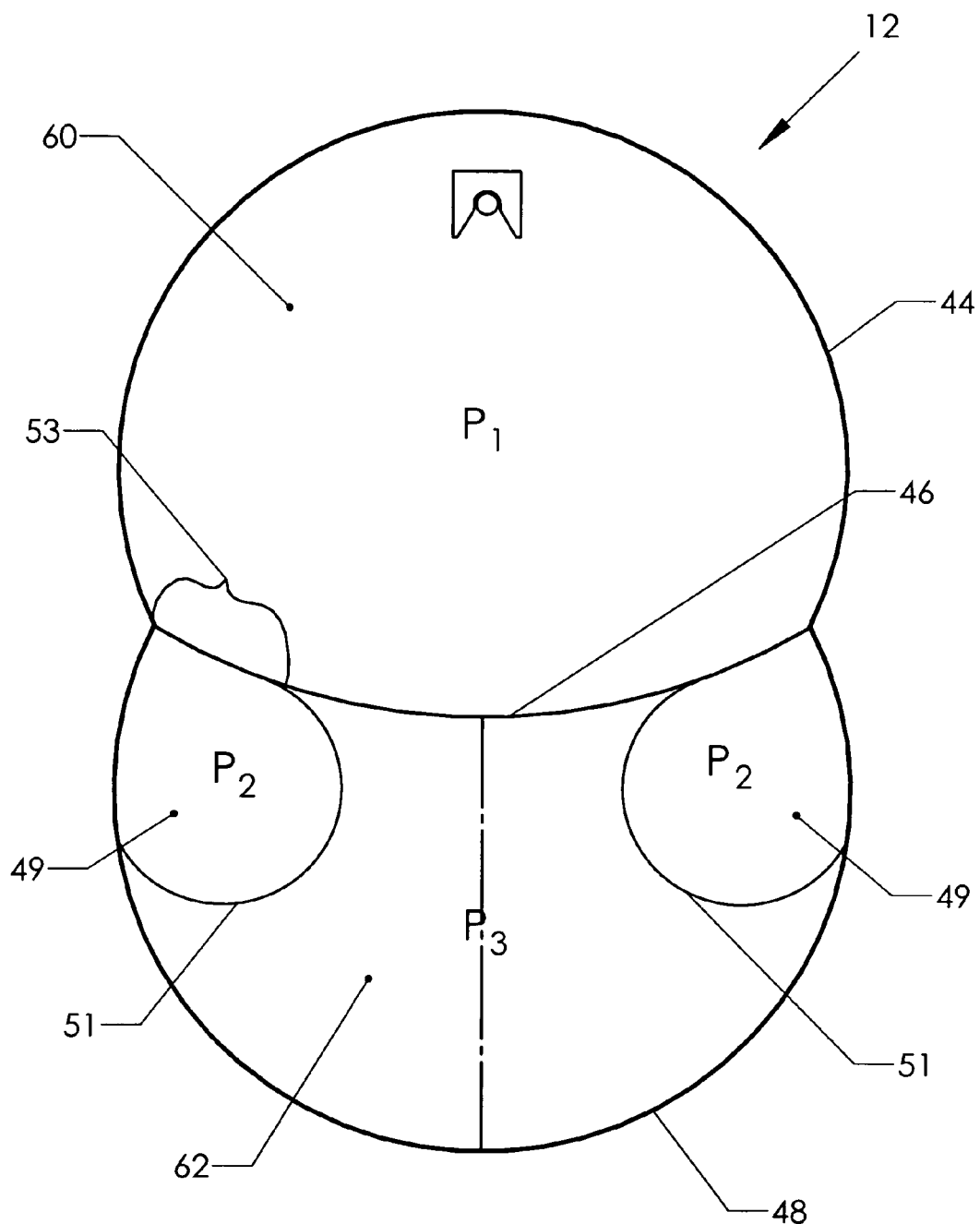
FIG. 17 is a sectional elevation view, showing the use of corrective bladders to improve the shape of the trough reflector.
Figure 18:
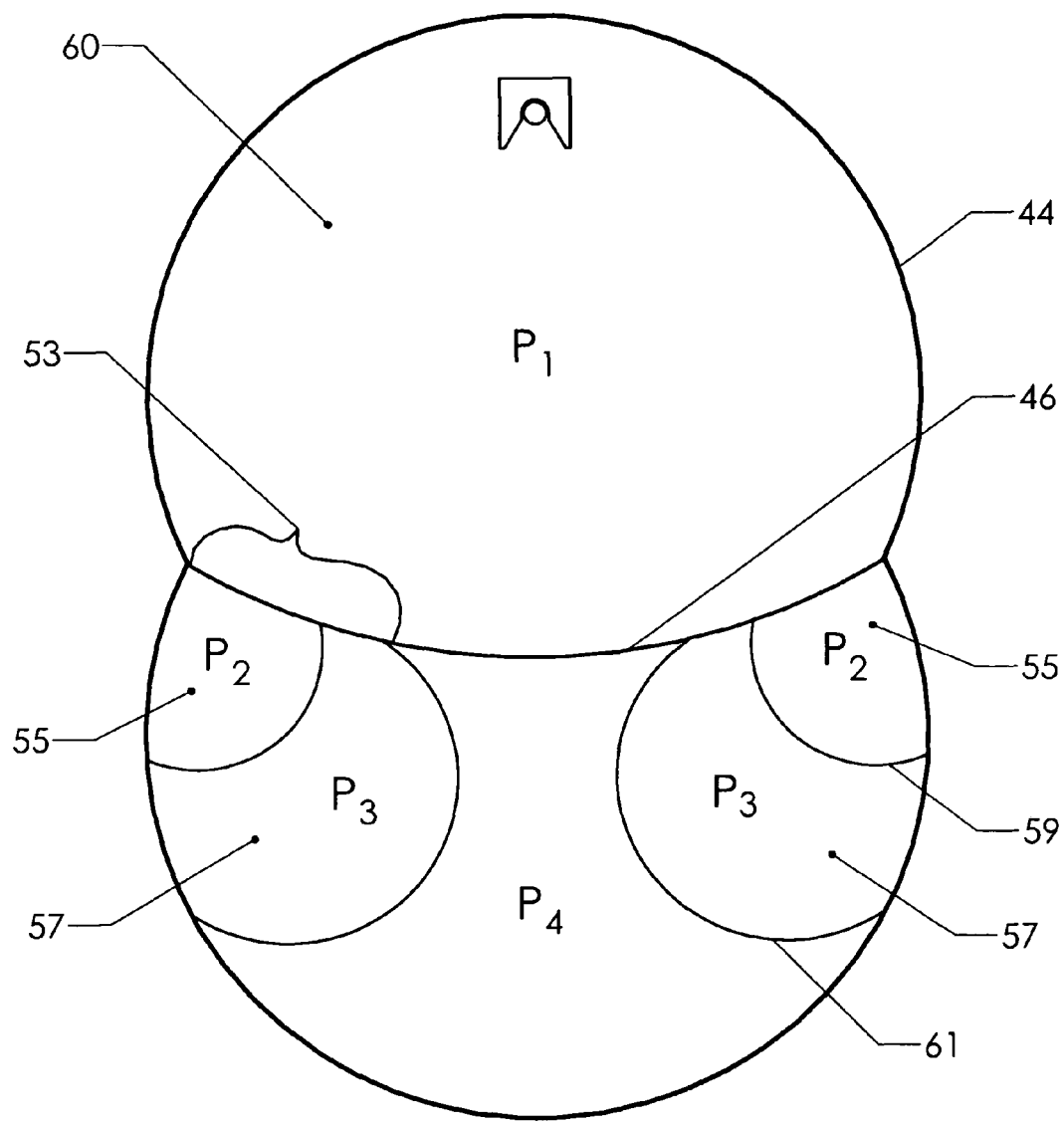
FIG. 18 is a sectional elevation view, showing the use of corrective bladders to improve the shape of the trough reflector.
Figure 19:
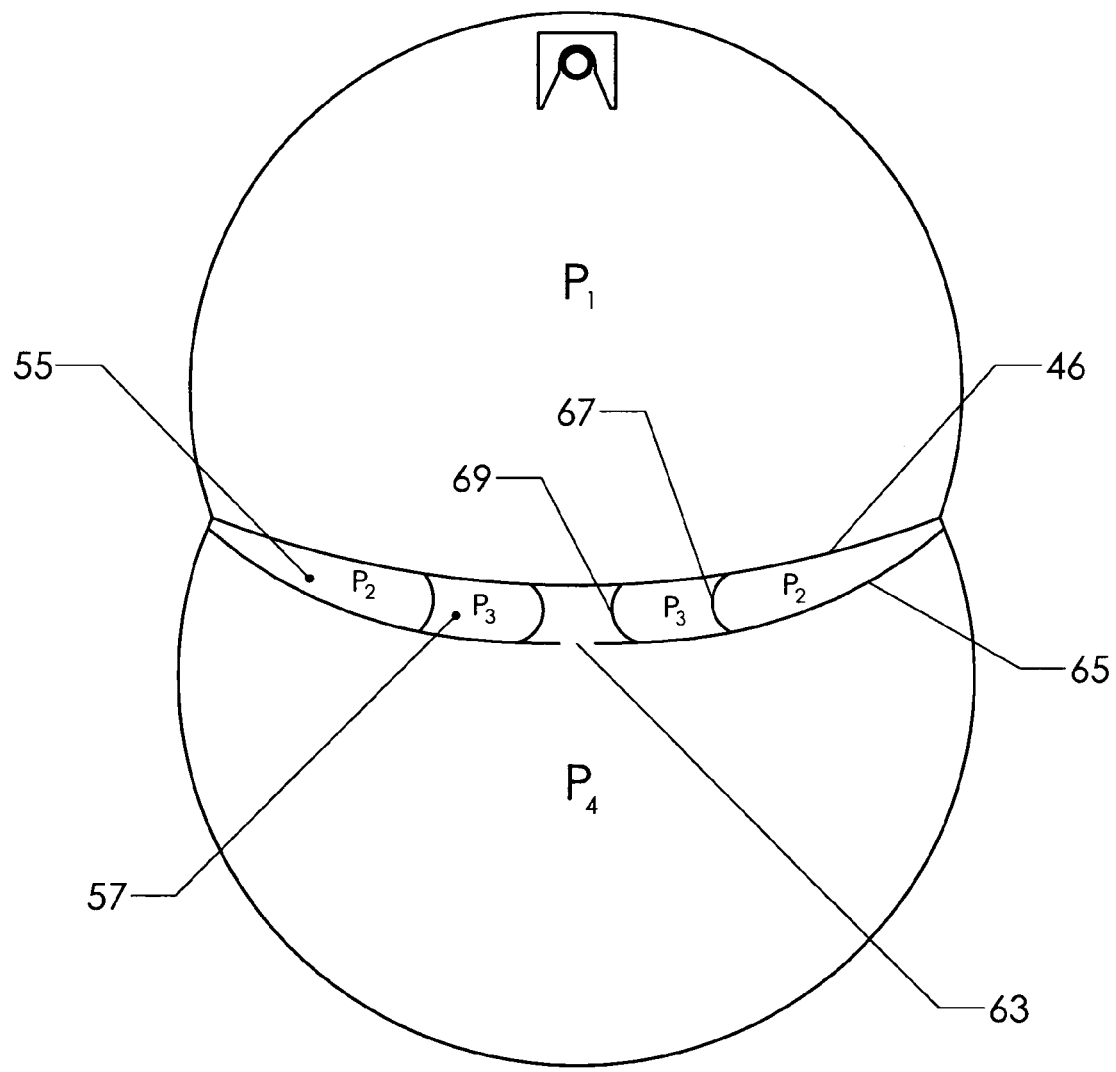
FIG. 19 is a sectional elevation view, showing the use of corrective bladders to improve the shape of the trough reflector.

The invention can be further optimized by refining the shape of middle reflective layer 46. The reader will recall that the ideal shape for a trough reflector is a parabolic cross section. However, the differential pressure between the reflector and back chambers deflects the middle reflective layer into a shape which is nearly cylindrical. Thus, it is desirable to "correct" the cylindrical shape so that it more closely approximates a parabola. FIGS. 17 through 19 illustrate embodiments designed to do this.

In FIG. 17, a pair of corrective bladders 49 has been added within back chamber 62. Each corrective bladder is formed by attaching a bladder layer 51 between middle reference layer 46 and back layer 48. The pressure within the corrective bladders is made lower than that within the reflector chamber but higher than that within the back chamber. This creates a flattened region 53 between the reflector chamber and each corrective bladder. The flattening of the curvature in this region causes the overall shape of middle reflective layer 46 to more closely approximate a parabola.

Of course, this concept can be carried further by adding more corrective bladders. FIG. 18 shows an embodiment incorporating two pairs of corrective bladders. First corrective bladders 55 lie toward the edges of the middle reflective layer, while second corrective bladders 57 are more toward the middle. First bladder layer 59 is used to create the first corrective bladders while second bladder layer 61 is used to create the second corrective bladders. Of course, the open ends of all the corrective bladders must be sealed to the end closures.

The pressure within the reflector chamber is greatest. The pressure within the first corrective bladder is less than that within the reflector chamber. The pressure within the second corrective bladder is less than the first corrective bladder and the pressure within the back chamber is lowest of all. From this configuration those skilled in the art will perceive that the curvature of middle reflective layer 46 is flattened to a greater extent in the area bounding the first corrective bladders and to a lesser extent in the area bounding the second corrective bladders. This configuration more closely approximates the desired parabola.

FIG. 19 shows an alternate approach to creating two pairs of corrective bladders. A single bladder layer 65 spans the width of the reflector. The individual bladders are created using two first bladder bulkheads 67 and second bladder bulkheads 69. The middle cavity created includes vent 63, which allows its pressure to equalize with that in the back chamber. The effect is essentially the same as for the embodiment of FIG. 19, though it is manufactured in a different way.

Figure 20:
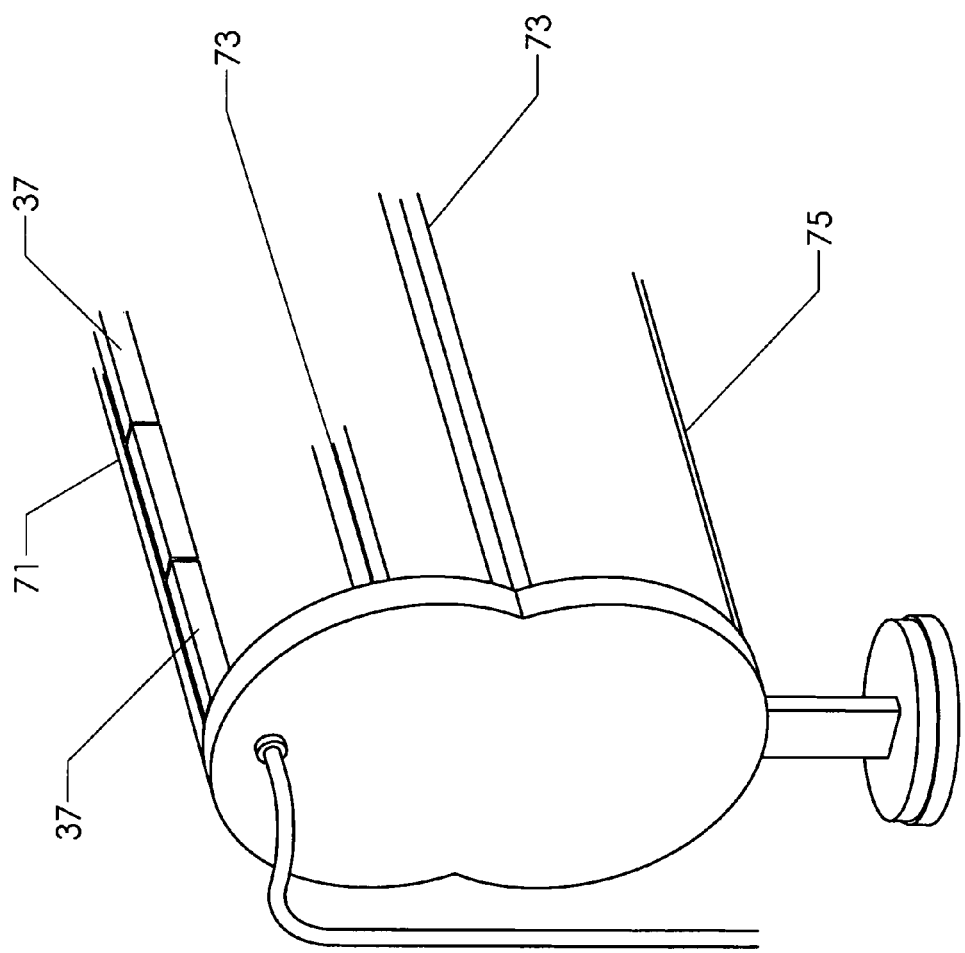
FIG. 20 is a perspective view, showing the use of brackets to hold the layers in place.
Figure 21:
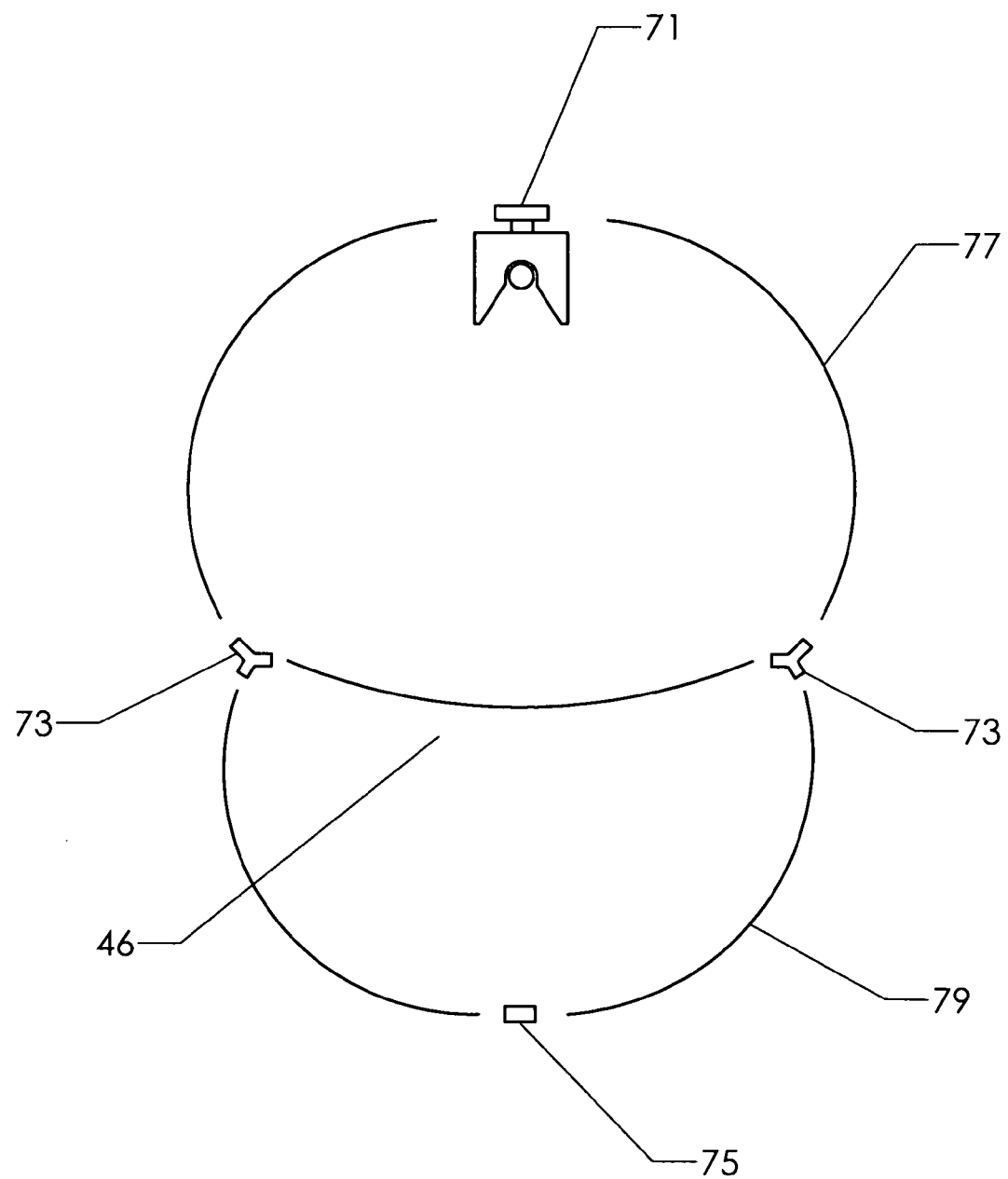
FIG. 21 is an elevation view, showing the use of removable layers.

The invention preferably uses thin and flexible films made of inexpensive substances such as MYLAR. Such films have a limited service life when placed outdoors. It is reasonable to expect that the films will need to be replaced approximately once per year. Accordingly, it is desirable to provide a design which facilitates easy replacement of the films. FIGS. 20 and 21 show such an embodiment.

In FIG. 20, the frame has been provided with four brackets spanning the distance between the two end closures. These are top bracket 71, two side brackets 73, and bottom bracket 75. Insulator blocks 37 (and the associated receiver tube) may be conveniently attached to top bracket 71. The brackets are used to attach the films. FIG. 21 shows a sectional elevation view through the brackets and the films. Clear layer 44 has been split into two split clear layers 77. Likewise, back layer 48 has been split into two split back layers 79. The edges of each of these are attached to a bracket. The back layer can of course be one piece which attaches to the side brackets, in which case the bottom bracket is omitted.

The brackets are shown as relatively thick pieces to aid visualization, but they may in fact be quite thin and flexible. In fact, a "bracket" which is simply a length of plastic zipper material will work. A thin and flexible bracket is in fact preferable since this will allow the chambers to flex and assume an optimal shape under pressure.

The reader will recall that the chambers only need to accommodate relatively low pressures (typically about 0.03 atmospheres over ambient pressure). Thus, the attachments to the brackets can be made using low-strength fastenings. One good approach is to provide ZIPLOCK fasteners along the brackets and along the edges of the films. These may be used to quickly remove an existing film and replace it with a new one. A small amount of leakage is allowable over time, as a pressure supply can be used to maintain the desired pressure.

The working fluid running through the receiver in each solar collector is preferably distributed and collected through a series of pumps and lines. The collectors can be connected in series, in parallel, or in any desired combination between the two. It is even possible to use different working fluids in different collectors within the same array.

The preceding descriptions have provided considerable detail regarding certain embodiments of the invention. However, the embodiments disclosed should be properly viewed as exemplary, rather than as an exhaustive listing. Numerous other embodiments of the present invention are possible, and are readily understood by those skilled in the art (having read the preceding disclosure). Thus, the scope of the invention should be fixed by the following claims, rather than by the examples given.

Having described our invention, we claim:

1. An optical collector for concentrating incoming rays of light, comprising:
   a. a pressurized reflector chamber having a central axis, said reflector chamber being made substantially of thin and flexible material, said reflector chamber having a first pressure;
   b. a pressurized back chamber parallel to said central axis, said back chamber being made substantially of thin and flexible material, said back chamber having a second pressure;
   c. a thin and flexible middle reflective layer parallel to said central axis, said middle reflective layer separating said reflector chamber form said back chamber; and
   d. wherein said first pressure is higher than said second pressure so that said middle reflective layer deflects toward said back chamber and thereby forms a focusing trough reflector;
   e. a first corrective bladder within said back chamber, wherein said first corrective bladder is pressurized to a pressure greater than the pressure within said back chamber but less than the pressure within said reflector chamber;
   f. a second corrective bladder within said back chamber, wherein said second corrective bladder is pressurized to a pressure greater than the pressure within said back chamber but less than the pressure within said first corrective bladder;
   g. a third corrective bladder within said back chamber, wherein said third corrective bladder is pressurized to a pressure greater than the pressure within said back chamber but less than the pressure within said reflector chamber;
   h. a fourth corrective bladder within said back chamber, wherein said fourth corrective bladder is pressurized to a pressure greater than the pressure within said back chamber but less than the pressure within said third corrective bladder.

2. An optical collector as recited in claim 1, wherein:
   a. said reflector chamber and said back chamber have open ends; and
   b. said open ends are closed by a pair of end closures.

3. An optical collector as recited in claim 1, wherein said first and second pressures are set so that said middle reflective layer creates an area of focus outside of said optical collector.

4. An optical collector as recited in claim 1, wherein said first and second pressures are set so that said middle reflective layer creates an area of focus inside said reflector chamber.

5. An optical collector as recited in claim 1, further comprising an azimuth pivot joint for pivoting said collector in order to track the motion of the sun.

6. An optical collector as recited in claim 1, further comprising a altitude pivot joint for pivoting said collector in order to track the motion of the sun.

7. An optical collector as recited in claim 5, further comprising a altitude pivot joint for pivoting said collector in order to track the motion of the sun.

8. An optical collector for concentrating incoming rays of light, comprising:
   a. a middle reflective layer, rectangular in shape, having a first edge, a second edge, a third edge, and a fourth edge;
   b. a central axis, parallel to said first and third edges of said middle reflective layer;
   c. a clear layer, rectangular in shape, having a first edge, a second edge, a third edge, and a fourth edge, with said first and third edges being parallel to said central axis;
   d. a back layer, rectangular in shape, having a first edge, a second edge, a third edge, and a fourth edge, with said first and third edges being parallel to said central axis;
   e. wherein said first edges of said clear layer, said middle reflective layer, and said back layer are joined together at a first union running parallel to said central axis;
   f. wherein said third edges of said clear layer, said middle reflective layer, and said back layer are joined together at a second union running parallel to said central axis;
   g. a reflector chamber formed by said clear layer and said middle reflective layer
   h. a back chamber formed by said back layer and said middle reflective layer;
   i. wherein said middle reflective layer, said clear layer, and said back layer, are all made of thin and flexible material;
   j. wherein said reflector chamber is pressurized to a first pressure; and
   k. wherein said back chamber is pressurized to a second pressure which is lower than said first pressure so that said middle reflective layer deflects toward said back chamber and thereby forms a focusing reflector;
   l. a first corrective bladder within said back chamber, wherein said first corrective bladder is pressurized to a pressure greater than the pressure within said back chamber but less than the pressure within said reflector chamber;
   m. a second corrective bladder within said back chamber, wherein said second corrective bladder is pressurized to a pressure greater than the pressure within said back chamber but less than the pressure within said first corrective bladder;
   n. a third corrective bladder within said back chamber, wherein said third corrective bladder is pressurized to a pressure greater than the pressure within said back chamber but less than the pressure within said reflector chamber;

o. a fourth corrective bladder within said back chamber, wherein said fourth corrective bladder is pressurized to a pressure greater than the pressure within said back chamber but less than the pressure within said third corrective bladder.

9. An optical collector as recited in claim 8, wherein:

a. said reflector chamber and said back chamber have open ends; and b. said open ends are closed by a pair of end closures.

10. An optical collector as recited in claim 8, wherein said first and second pressures of said reflector chamber and said back chamber are set so that said middle reflective layer creates an area of focus outside of said optical collector.

11. An optical collector as recited in claim 8, wherein said first and second pressures of said reflector chamber and said back chamber are set so that said middle reflective layer creates an area of focus inside said reflector chamber.

12. An optical collector as recited in claim 8, further comprising an azimuth pivot joint for pivoting said collector in order to track the motion of the sun.

13. An optical collector as recited in claim 8, further comprising an altitude pivot joint for pivoting said collector in order to track the motion of the sun.

14. An optical collector as recited in claim 12, further comprising an altitude pivot joint for pivoting said collector in order to track the motion of the sun.

* * * * *